United States Patent
Uto et al.

(10) Patent No.: US 9,680,037 B2
(45) Date of Patent: Jun. 13, 2017

(54) SOLAR CELL AND METHOD OF MANUFACTURING SAME, AND SOLAR CELL MODULE

(71) Applicant: KANEKA CORPORATION, Osaka-shi, Osaka (JP)

(72) Inventors: Toshihiko Uto, Settsu (JP); Daisuke Adachi, Settsu (JP)

(73) Assignee: KANEKA CORPORATION, Osaka-shi, Osaka (JP)

(*) Notice: Subject to any disclaimer, the term of this patent is extended or adjusted under 35 U.S.C. 154(b) by 0 days.

(21) Appl. No.: 14/654,453

(22) PCT Filed: Oct. 25, 2013

(86) PCT No.: PCT/JP2013/079014
§ 371 (c)(1),
(2) Date: Jun. 19, 2015

(87) PCT Pub. No.: WO2014/097741
PCT Pub. Date: Jun. 26, 2014

(65) Prior Publication Data
US 2015/0372169 A1 Dec. 24, 2015

(30) Foreign Application Priority Data
Dec. 20, 2012 (JP) .................. 2012-277528

(51) Int. Cl.
*H01L 31/0224* (2006.01)
*H01L 31/0465* (2014.01)
(Continued)

(52) U.S. Cl.
CPC ........... *H01L 31/022433* (2013.01); *H01L 31/022425* (2013.01); *H01L 31/022466* (2013.01);
(Continued)

(58) Field of Classification Search
CPC ..... H01L 31/022441; H01L 31/022433; H01L 31/202; H01L 31/0747; H01L 31/0465
See application file for complete search history.

(56) References Cited

U.S. PATENT DOCUMENTS

2008/0023069 A1* 1/2008 Terada .............. H01L 31/02167
136/256
2009/0223562 A1* 9/2009 Niira ................... H01L 31/1804
136/256
(Continued)

FOREIGN PATENT DOCUMENTS

JP 2009231840 A 10/2009
JP 2011199045 A 10/2011
(Continued)

OTHER PUBLICATIONS

Isabella et al, Modulated surface textures for enhanced light trapping in thin-film silicon solar cells, 2010, Applied Physics Letters pp. 101106-1 through 101106-3.*
(Continued)

*Primary Examiner* — Bethany L Martin
(74) *Attorney, Agent, or Firm* — Alleman Hall Creasman & Tuttle LLP

(57) ABSTRACT

A solar cell of the present invention includes a collecting electrode on one main surface of a photoelectric conversion section. The collecting electrode includes first and second electroconductive layers in this order from the photoelectric conversion section side, and an insulating layer between the first and second electroconductive layers, the insulating layer having an opening section formed therein. The first electroconductive layer is covered with the insulating layer, contains a low-melting-point material, and is conductively connected with a part of the second electroconductive layer via the opening section. The surface roughness of the second electroconductive layer is preferably 1.0 μm to 10.0 μm. The
(Continued)

second electroconductive layer is preferably formed by a plating method. In order to conductively connect the first and second electroconductive layers, annealing of the first electroconductive layer by heating is preferably performed prior to forming the second electroconductive layer.

7 Claims, 7 Drawing Sheets

(51) Int. Cl.
    *H01L 31/0747*     (2012.01)
    *H01L 31/18*     (2006.01)
    *H01L 31/20*     (2006.01)

(52) U.S. Cl.
    CPC ...... *H01L 31/0465* (2014.12); *H01L 31/0747* (2013.01); *H01L 31/1864* (2013.01); *H01L 31/1884* (2013.01); *H01L 31/202* (2013.01); *Y02E 10/50* (2013.01)

(56) References Cited

U.S. PATENT DOCUMENTS

| | | |
|---|---|---|
| 2009/0239331 A1 | 9/2009 | Xu et al. |
| 2010/0101639 A1* | 4/2010 | Yeh .................. B23K 35/0238 136/256 |
| 2010/0170568 A1* | 7/2010 | Kawaguchi ............ C03C 3/064 136/256 |
| 2012/0291844 A1 | 11/2012 | Tsuge |
| 2012/0305063 A1* | 12/2012 | Moslehi .......... H01L 31/035281 136/256 |
| 2013/0074903 A1* | 3/2013 | Tohoda ........... H01L 31/022433 136/244 |
| 2013/0125964 A1* | 5/2013 | Mo ................. H01L 31/022441 136/255 |
| 2014/0360567 A1* | 12/2014 | Seutter ................. H01B 1/023 136/256 |

FOREIGN PATENT DOCUMENTS

| | | |
|---|---|---|
| JP | 2011204955 A | 10/2011 |
| WO | 2011045287 A1 | 4/2011 |

OTHER PUBLICATIONS

International Bureau of WIPO, International Preliminary Report on Patentability Issued in Application No. PCT/JP2013/079014, Oct. 25, 2013, WIPO, 5 pages.

ISA Japanese Patent Office, International Search Report of PCT/JP2013/079014, Feb. 4, 2014, 4 pages.

* cited by examiner before annealing
(after printing)

after annealing before sintering after sintering onset
(initial sintering stage)

after sintering onset

SOLAR CELL AND METHOD OF MANUFACTURING SAME, AND SOLAR CELL MODULE

TECHNICAL FIELD

The present invention relates to a solar cell and a method of manufacturing the same. Further, the present invention relates to a solar cell module.

BACKGROUND ART

Since energy issues and global environmental issues are becoming more serious, solar cells are receiving more attention as an alternative energy for replacing fossil fuels. In the solar cell, carriers (electrons and holes) generated by light irradiation on a photoelectric conversion section composed of a semiconductor junction or the like are extracted to an external circuit to generate electricity. A collecting electrode is provided on the photoelectric conversion section of the solar cell for efficiently extracting carriers generated at the photoelectric conversion section to the external circuit.

For example, in a heterojunction solar cell having amorphous silicon layers and transparent electrode layers on a crystalline silicon substrate, collecting electrode(s) are provided on the transparent electrode layer(s). In this configuration, the transparent electrode layer can perform a function as a collecting electrode, and therefore in principle, it is not necessary to specially provide a collecting electrode. However, since a conductive oxide, such as indium tin oxide (ITO) or zinc oxide, forming the transparent electrode layer has a resistivity higher than that of metal, there is such a problem that the internal resistance of the solar cell increases. Thus, a collecting electrode (metal electrode as an auxiliary electrode) is provided on the surface of the transparent electrode layer to improve current extraction efficiency.

The solar cells are generally modularized by connecting a plurality of cells in series or in parallel via a wiring member. In modularization, the collecting electrode of the solar cell is electrically connected to the wiring member with an electroconductive resin adhesive or the like interposed therebetween.

The collecting electrode of the solar cell is generally formed by pattern-printing a silver paste by a screen printing method. On the other hand, a method of forming a collecting electrode by a plating method has also been developed. For example, a resist material layer having an opening matching the shape (e.g., comb shape) of a collecting electrode is formed on a transparent electrode layer of a photoelectric conversion section, and a metal layer is formed at the resist opening of the transparent electrode layer by electroplating. Thereafter, the resist is removed to form a collecting electrode having a specific shape. Patent Document 1 discloses a method in which an insulating film composed of $SiO_2$ is formed on a transparent electrode layer, an insulating layer is then patterned using a resist, and a metal layer is formed in the opening by electroplating.

The silver paste and the like contain a resin material, and therefore have a low electroconductivity, whereas the metal layer formed by a plating method has a high electroconductivity. Thus, when a collecting electrode is formed by a plating method, enhancement of efficiency of the solar cell (particularly, improvement of fill factor by reduction of resistance) can be expected. However, the resist material is expensive, and an under-layer forming step, a resist removing step, and the like are required for performing plating, so that steps for forming an electrode are complicated. Thus, the method of forming a collecting electrode in the opening of a resist by a plating method has the problem that material and process costs are increased to deteriorate practicability.

In view of the problem, a method has been proposed in which a collecting electrode of a solar cell is formed by a plating method without using a resist. For example, Patent Document 2 discloses a method in which an insulating layer of $SiO_2$ or the like is provided on a transparent electrode, a groove extending through the insulating layer is then provided to expose the surface or side surface of a transparent electrode layer, and a metal collecting electrode is formed so as to be in conduction with the exposed part of the transparent electrode. Specifically, a method has been proposed in which a metal seed is formed on the exposed part of the transparent electrode layer by a light-induced plating method or the like, and a metal electrode is formed by electroplating with the metal seed as an origination point. This method is more advantageous in terms of material and process costs because it is not necessary to use a resist. By providing a metal seed having low resistance, contact resistance between the transparent electrode layer and the collecting electrode can be reduced.

Patent Document 3 proposes a method in which a discontinuous insulating layer having an opening is formed on an electroconductive seed, and a metal electrode is formed via the opening of the insulating layer by electroplating.

PRIOR ART DOCUMENTS

Patent Documents

Patent Document 1: JP-A-2011-204955
Patent Document 2: JP-A-2011-199045
Patent Document 3: WO 2011/045287

SUMMARY OF THE INVENTION

Problems to be Solved by the Invention

According to the methods in Patent Document 2 and Patent Document 3, a collecting electrode of a thin line pattern can be formed by a plating method without using an expensive resist material. However, a method in which a metal seed as an origination point in electroplating is formed by a light-induced plating method as in Patent Document 2 can be applied for the n-layer side, but cannot be applied for the p-layer side in a semiconductor junction. Generally, it is known that a heterojunction solar cell has the highest characteristics when it has a configuration in which an n-type single crystal silicon substrate is used and the heterojunction on the p-layer side is set at the light incident side, and the method in Patent Document 2 is not suitable for formation of a collecting electrode on the light incident side in a heterojunction solar cell in which the p-layer side is the light incident side.

The collecting electrode formed by a plating method has the problem that adhesion with a wiring member in modularization is not sufficient as compared to a collecting electrode formed using a silver paste. The reason for low adhesion is presumed to be that a metal layer formed by plating does not contain a resin and therefore has low adhesion with a resin adhesive.

Patent Document 1 proposes that by adjusting the plating current density and the like during formation of a collecting electrode to control the surface roughness Ra of the collecting electrode within a range of 0.1 to 0.6 μm, adhesion between a plating electrode and a resin adhesive can be improved. However, studies by the present inventors have shown that even when Ra falls within the range proposed in Patent Document 1, adhesion between the collecting electrode and the adhesive is not sufficient. For further increasing Ra, a collecting electrode should be formed under a high current density condition, problematically leading to an increase in resistance of the collecting electrode.

On the other hand, in Patent Document 3, for forming an opening in an insulating layer, a seed should have sufficient roughness, or the thickness of the insulating layer should be decreased to several nanometers so that the insulating layer is not locally film-deposited. For forming an opening in the insulating layer, the surface roughness of the seed should be several tens of micrometers. In this case, adhesion between the plating electrode formed on the seed and the adhesive is not sufficient. On the other hand, when the thickness of the insulating layer is decreased to several nanometers, such a defect occurs that a pinhole is generated in the insulating layer on the transparent electrode layer which is not provided with a seed, so that a metal is deposited at an undesired location.

As described above, formation of a collecting electrode by a plating method is expected to contribute to improvement of conversion characteristics and reduction of production costs of solar cells, but a practical collecting electrode having all of reduced resistance (improved conversion characteristics), adhesion with a resin adhesive or the like after modularization, and high productivity has not been obtained yet. It is an object of the present invention to improve conversion efficiency of the solar cell and reduce manufacturing costs of the solar cell by solving problems of the prior art associated with formation of a collecting electrode of the solar cell as described above.

Means for Solving the Problems

As a result of conducting vigorous studies in view of the problems, the present inventors have found that by using a specified collecting electrode, conversion efficiency of a solar cell can be improved, and further the collecting electrode can be formed at low costs. Further, the present inventors have found that when a module is prepared using the solar cell, reliability of the module can be improved, thus leading to completion of the present invention.

The present invention relates to a solar cell including: a photoelectric conversion section; and a collecting electrode on one main surface of the photoelectric conversion section. The collecting electrode includes a first electroconductive layer and a second electroconductive layer in this order from the photoelectric conversion section side, and further includes an insulating layer, having an opening section formed therein, between the first electroconductive layer and the second electroconductive layer. A first electroconductive layer 71 is covered with an insulating layer 9 having an opening section. The first electroconductive layer contains a low-melting-point material, and the thermal-fluidization onset temperature $T_1$ of the low-melting-point material is lower than the heat-resistant temperature of the photoelectric conversion section. A part of the second electroconductive layer is conductively connected with the first electroconductive layer. The surface roughness Ra2 of the second electroconductive layer is preferably 1.0 µm or more and 10.0 µm or less.

The surface roughness Ra1 of the first electroconductive layer is preferably 1.0 µm or more. Ra1 is preferably 10.0 µm or less.

In one embodiment, the photoelectric conversion section includes a silicon-based thin film and a transparent electrode layer in this order on one main surface of a crystalline silicon substrate of a first conductivity type, and includes a collecting electrode on the transparent electrode layer. In such an embodiment, the thermal-fluidization onset temperature $T_1$ of the low-melting-point material is preferably 250° C. or lower.

Preferably, the solar cell of the present invention also has an insulating layer formed on a first electroconductive layer-non-formed region of the photoelectric conversion section.

Further, the present invention relates to a solar cell module including the solar cell. The solar cell module includes a solar cell and a wiring member, and the solar cell is connected to another solar cell or an external circuit via the wiring member. Preferably, the wiring member is bonded to the collecting electrode of the solar cell by a resin adhesive containing electroconductive fine particles.

The present invention relates to a method of manufacturing the solar cell. The manufacturing method of the present invention includes: a first electroconductive layer forming step of forming on a photoelectric conversion section a first electroconductive layer containing a low-melting-point material; an insulating layer forming step of forming an insulating layer on the first electroconductive layer; and a plating step of forming a second electroconductive layer by a plating method, in this order. Preferably, an annealing treatment is performed at an annealing temperature Ta higher than the thermal-fluidization onset temperature $T_1$ of the low-melting-point material in the insulating layer forming step, or after the insulating layer forming step and before the plating step. An opening is formed in the insulating layer by the annealing treatment. The annealing temperature Ta is preferably 250° C. or lower.

Preferably, the first electroconductive layer is formed using a paste material having a viscosity of 20 to 500 Pa·s at 25° C.

Effects of the Invention

According to the present invention, a collecting electrode can be formed by a plating method, and therefore the collecting electrode is made less resistant, so that conversion efficiency of a solar cell can be improved. According to the present invention, a pattern electrode can be formed by a plating method without using a mask or a resist for pattern formation. In the present invention, adhesion between a second electroconductive layer and a resin adhesive can be improved when the surface roughness of the second electroconductive layer is in a specific range. Thus, a solar cell having high efficiency and high reliability can be cheaply provided.

DESCRIPTION OF EMBODIMENTS

Figure 1:
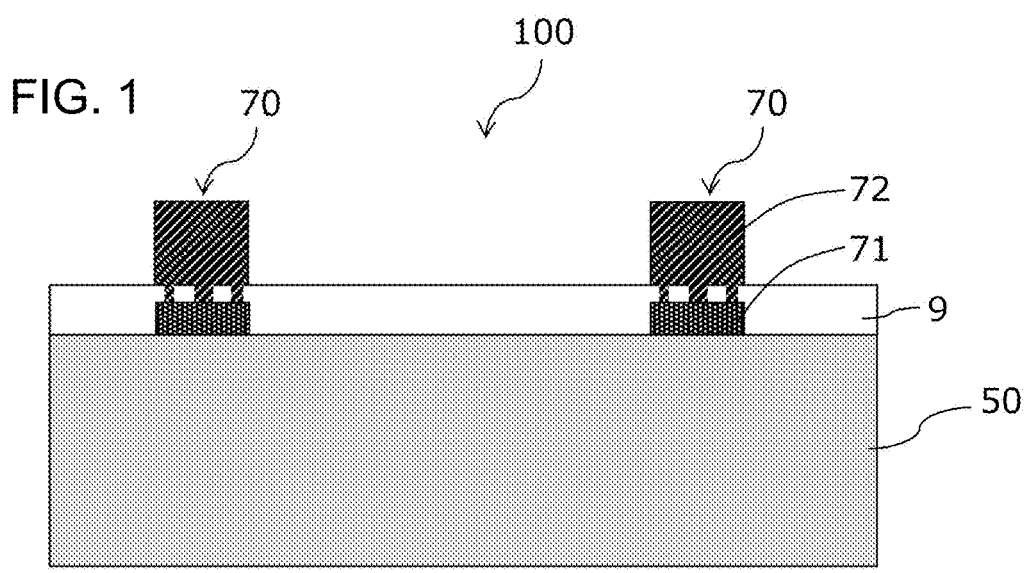
FIG. 1 is a schematic sectional view showing a solar cell of the present invention.

As schematically shown in FIG. 1, a solar cell 100 of the present invention includes a collecting electrode 70 on one main surface of a photoelectric conversion section 50. The collecting electrode 70 includes a first electroconductive layer 71 containing a low-melting-point material, and a second electroconductive layer 72 in this order from the photoelectric conversion section 50 side. An insulating layer 9 is formed between the first electroconductive layer 71 and the second electroconductive layer 72, and the first electroconductive layer 71 is covered with the insulating layer 9. A part of the second electroconductive layer 72 is conductively connected with the first electroconductive layer 71 via an opening section 9h of the insulating layer 9. The low-melting-point material of the first electroconductive layer 71 preferably has a thermal-fluidization onset temperature $T_1$ lower than the heat-resistant temperature of the photoelectric conversion section 50. The thermal-fluidization onset temperature $T_1$ is, for example 250° C. or lower.

The present invention will be described more in detail below taking as an example a heterojunction crystalline silicon solar cell (hereinafter, referred to as a "heterojunction solar cell" in some cases) as one embodiment of the present invention. The heterojunction solar cell is a crystalline silicon-based solar cell in which a silicon-based thin-film having a band gap different from that of a single-crystal silicon is formed on a surface of a single-crystal silicon substrate of a first conductivity type to produce a diffusion potential. The silicon-based thin-film is preferably amorphous. Above all, a heterojunction solar cell having a thin intrinsic amorphous silicon layer interposed between a conductive amorphous silicon-based thin-film for forming a diffusion potential and a crystalline silicon substrate is known as one configuration of a crystalline silicon solar cell with the highest conversion-efficiency.

Figure 2:
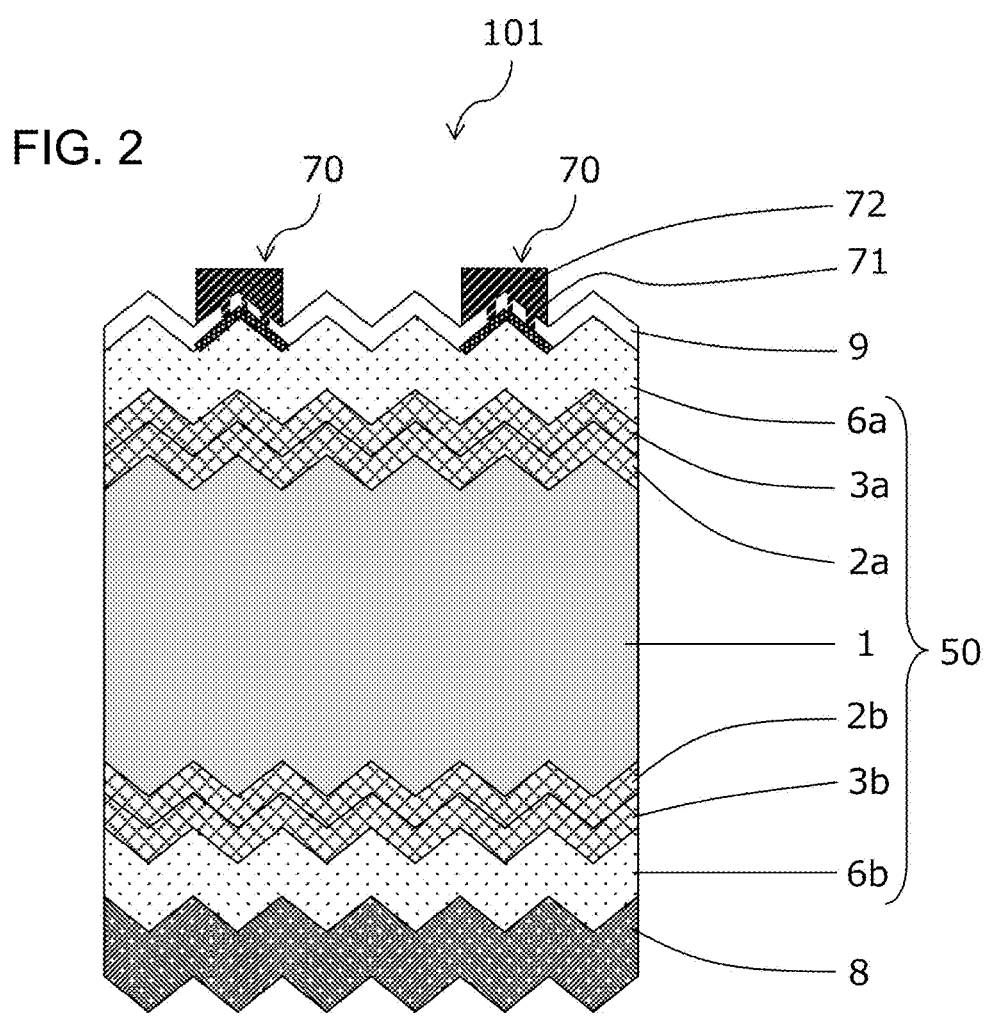
FIG. 2 is a schematic sectional view showing a heterojunction solar cell according to one embodiment.

FIG. 2 is a schematic sectional view of a crystalline silicon-based solar cell (heterojunction solar cell) according to one embodiment of the present invention. A heterojunction solar cell 101 includes, as a photoelectric conversion section 50, a conductive silicon-based thin-film 3a and a light incident side transparent electrode layer 6a in this order on one surface (surface on the light incident side) of a single-crystal silicon substrate 1 of a first conductivity type. A conductive silicon-based thin-film 3b and a back side transparent electrode layer 6b are preferably provided in this order on the other surface (surface on the side opposite to the light incident side) of the single-crystal silicon substrate 1 of the first conductivity type. A collecting electrode 70 including a first electroconductive layer 71 and a second electroconductive layer 72 is formed on the light incident side transparent electrode layer 6a of the surface of the photoelectric conversion section 50. An insulating layer 9 is formed between the first electroconductive layer 71 and the second electroconductive layer 72.

Intrinsic silicon-based thin-films 2a and 2b are preferably provided between the single-crystal silicon substrate 1 of the first conductivity type and the conductive silicon-based thin-films 3a and 3b. A back side metal electrode 8 is preferably provided on the back side transparent electrode layer 6b.

First, the single-crystal silicon substrate 1 of the first conductivity type used in the heterojunction solar cell will be described. Generally, the single-crystal silicon substrate contains impurities that supply charges to silicon for imparting conductivity. The single-crystal silicon substrate is classified into an n-type which contains atoms for introducing electrons into silicon atoms (e.g. phosphorus) and a p-type which contains atoms for introducing holes into silicon atoms (e.g. boron). That is, the "first conductivity type" in the present invention means one of the n-type and the p-type.

In a heterojunction solar cell, electron/hole pairs can be efficiently separated and collected by setting a reverse junction as a heterojunction on the incident side at which light incident to the single-crystal silicon substrate is absorbed most, thereby providing a strong electric field. Therefore, the heterojunction on the light incident side is preferably a reverse junction. When holes and electrons are compared, electrons, which are smaller in effective mass and scattering cross section, are generally larger in mobility. Accordingly, it is preferred that the single-crystal silicon substrate 1 is an n-type single-crystal silicon substrate. In order to enhance a light confinement, the single-crystal silicon substrate 1 preferably has textured structure in its surface.

A silicon-based thin-film is formed on the surface of the single-crystal silicon substrate 1 of the first conductivity type on which a texture is formed. The method for forming these silicon-based thin-film layers is preferably plasma enhanced CVD. Conditions used for forming the silicon-based thin-film layers by a plasma enhanced CVD method are preferably as follows: a substrate temperature of 100 to 300° C., a pressure of 20 to 2600 Pa, and a high-frequency power density of 0.004 to 0.8 W/cm². A source gas used to form the silicon-based thin-film layers may be a silicon-containing gas such as $SiH_4$ or $Si_2H_6$, or a mixed gas of silicon-based gas and $H_2$.

The conductive silicon-based thin-film 3 is a silicon-based thin-film of the first conductivity type or an opposite conductivity type. For example, when an n-type single-crystal silicon substrate is used as the single-crystal silicon substrate 1 of the first conductivity type, the silicon-based thin-film of the first conductivity type and the silicon-based thin-film of the opposite conductivity type are n- and p-types, respectively. A dopant gas for forming the p-type or the n-type silicon-based thin-film is preferably, for example, $B_2H_6$ or $PH_3$. The amount of impurity such as P or B added is sufficient to be a trace amount; thus, it is preferred to use a mixed gas wherein $B_2H_6$ or $PH_3$ is beforehand diluted with $SiH_4$ or $H_2$. When a gas containing a different element, such as $CH_4$, $CO_2$, $NH_3$, or $GeH_4$, is added thereto, silicon is alloyed so that the energy gaps of the conductive silicon-based thin-films can be changed.

Examples of the silicon-based thin-film include an amorphous silicon thin-film and microcrystalline silicon (a thin-film including amorphous silicon and crystalline silicon).

Among them, an amorphous silicon-based thin-film is preferably used. When an n-type single-crystal silicon substrate is used as the single-crystal silicon substrate 1 of the first conductivity type, examples of the preferred structure of the photoelectric conversion section 50 include a stacked structure in the order of transparent electrode layer 6a/p-type amorphous silicon-based thin-film 3a/i-type amorphous silicon-based thin-film 2a/n-type single-crystal silicon substrate 1/i-type amorphous silicon-based thin-film 2b/n-type amorphous silicon-based thin-film 3b/transparent electrode layer 6b. In this case, for the aforementioned reason, the light incident surface is preferably on the p layer side.

The intrinsic silicon-based thin-films 2a and 2b are preferably i-type hydrogenated amorphous silicon composed of silicon and hydrogen. When i-type hydrogenated amorphous silicon is formed on a single-crystal silicon substrate by a CVD method, surface passivation can be effectively performed while suppressing diffusion of impurities to the single-crystal silicon substrate. When the amount of hydrogen in the film is changed along the thickness direction, the layer may have an energy gap profile effective for collecting carriers.

The p-type silicon-based thin-film is preferably a p-type hydrogenated amorphous silicon layer, a p-type amorphous silicon carbide layer, or a p-type amorphous silicon oxide layer. The p-type hydrogenated amorphous silicon layer is preferable for suppressing impurity diffusion and reducing series resistance. On the other hand, the p-type amorphous silicon carbide layer and the p-type amorphous silicon oxide layer are wide-gap low-refractive index layers, and therefore preferable in the sense that the optical loss can be reduced.

The photoelectric conversion section 50 of the heterojunction solar cell 101 preferably includes transparent electrode layers 6a and 6b on the conductive silicon-based thin-films 3a and 3b. Each transparent electrode layer is formed by a transparent electrode layer forming step. The transparent electrode layers 6a and 6b have a conductive oxide as a main component. As the conductive oxide, for example, zinc oxide, indium oxide, and tin oxide may be used alone or in a mixture thereof. From the viewpoints of electroconductivity, optical characteristics, and long-term reliability, indium-based oxides including indium oxide are preferable. Among them, those having indium tin oxide (ITO) as a main component are more suitably used. Here, the wording "as a main component" means that the content is more than 50% by weight, preferably 70% by weight or more, more preferably 90% by weight or more. The transparent electrode layer may be a single layer or a layered structure composed of multiple layers.

A dopant can be added to the transparent electrode layer. For example, when zinc oxide is used for the transparent electrode layer, examples of the dopant include aluminum, gallium, boron, silicon, and carbon. When indium oxide is used for the transparent electrode layer, examples of the dopant include zinc, tin, titanium, tungsten, molybdenum, and silicon. When tin oxide is used for the transparent electrode layer, examples of the dopant include fluorine.

The dopant can be added to one or both of the light incident side transparent electrode layer 6a and the back side transparent electrode layer 6b. In particular, the dopant is preferably added to the light incident side transparent electrode layer 6a. By adding the dopant to the light incident side transparent electrode layer 6a, the transparent electrode layer itself is made less resistive, and the resistance loss between the transparent electrode layer 6a and the collecting electrode 70 can be suppressed.

The thickness of the light incident side transparent electrode layer 6a is preferably set to 10 nm or more and 140 nm or less, in view of transparency, electroconductivity, and reduction of light reflection. The role of the transparent electrode layer 6a is to transport carriers to the collecting electrode 70, and it suffices that the transparent electrode layer 6a has a level of electroconductivity required for this purpose, and the thickness of the transparent electrode layer 6a is preferably 10 nm or more. By ensuring that the thickness is 140 nm or less, the absorption loss at the transparent electrode layer 6a is kept low, so that a reduction in photoelectric conversion efficiency associated with a reduction in transmittance can be suppressed. When the thickness of the transparent electrode layer 6a falls within the aforementioned range, an increase in carrier concentration within the transparent electrode layer can also be prevented, and therefore a reduction in photoelectric conversion efficiency associated with a reduction in transmittance in an infrared range is also suppressed.

The method for forming a transparent electrode layer is not particularly limited, but a physical vapor deposition method such as a sputtering method, a chemical vapor deposition (MOCVD) method utilizing a reaction of an organic metal compound with oxygen or water, or the like is preferable. In any formation methods, energy from heat or plasma discharge may be utilized.

The substrate temperature during the formation of the transparent electrode layer may appropriately set. For example, when an amorphous silicon-based thin-film is used as a silicon-based thin-film, the substrate temperature is preferably 200° C. or lower. By ensuring that the substrate temperature is 200° C. or lower, desorption of hydrogen from the amorphous silicon layer and associated generation of a dangling bond at a silicon atom can be suppressed, and as a result, conversion efficiency can be improved.

A back side metal electrode 8 is preferably formed on the back side transparent electrode layer 6b. For the back side metal electrode 8, it is desirable to use a material having a high reflectivity in a near-infrared to infrared range, and having high electroconductivity and chemical stability. Examples of the material satisfying these characteristics include silver and aluminum. The method for forming a back side metal electrode layer is not particularly limited, and a physical vapor deposition method such as a sputtering method or a vacuum vapor deposition method, a printing method such as screen printing, or the like is applicable.

The collecting electrode 70 is formed on the transparent electrode layer 6a. The collecting electrode 70 includes a first electroconductive layer 71 and a second electroconductive layer 72. The first electroconductive layer 71 contains a low-melting-point material. The low-melting-point material preferably has a thermal-fluidization onset temperature $T_1$ that is lower than the heat-resistant temperature of the photoelectric conversion section.

The insulating layer 9 is formed between the first electroconductive layer 71 and the second electroconductive layer 72. In the collecting electrode 70 of the present invention, a part of the second electroconductive layer 72 is conductively connected with the first electroconductive layer 71 via the opening section 9h of the insulating layer 9. Here, the phrase "a part of - - - is conductively connected with - - - via the opening section of the insulating layer" refers to a state in which conductive connection is established by filling the opening section of the insulating layer, which covers the first electroconductive layer, with the material of the second electroconductive layer. As long as the first electroconductive layer and the second electroconductive layer are conductively connected with each other, the opening section may be such that the insulating layer 9 is locally very thin with the thickness of several nanometers (a complete hole is not formed). Even when the opening section is formed in the insulating layer, and conductive connection is established between the first electroconductive layer 71 and the second electroconductive layer via an oxide covering or the like formed on the surface of the first electroconductive layer, the second electroconductive layer is considered to be conductively connected with the first electroconductive layer via the opening section of the insulating layer. For example, when the low-melting-point material of the first electroconductive layer 71 is a metallic material such as aluminum, mention is made of a state in which the material of the second electroconductive layer, which fills the inside of the opening section of the insulating layer, is conductively connected with the first electroconductive layer via an oxide covering formed on the surface of the first electroconductive layer.

The method for forming an opening section is not particularly limited, but in the present invention, a method is suitably employed in which after forming the insulating layer 9 on the first electroconductive layer 71, the layer is heated (annealed) to a temperature equal to or higher than the thermal-fluidization onset temperature $T_1$ of the low-melting-point material. As a result of heating the first electroconductive layer, the low-melting-point material is fluidized to cause a change in surface shape of the first electroconductive layer, and accordingly an opening (cracks) can be generated in the insulating layer 9 formed on the first electroconductive layer 71.

In the present invention, the surface roughness Ra2 of the second electroconductive layer 72 is preferably 1.0 μm or more and 10.0 μm or less. When the surface roughness Ra2 of the second electroconductive layer is in the aforementioned range, contact between an electroconductive resin adhesive used during preparation of a module and the collecting electrode is improved, so that a resistance loss can be suppressed. The surface roughness Ra1 of the first electroconductive layer 71 is preferably 1.0 μm or more. When the surface roughness of the first electroconductive layer is in the aforementioned range, adhesion strength between the first electroconductive layer and the second electroconductive layer can be increased.

Figure 3:
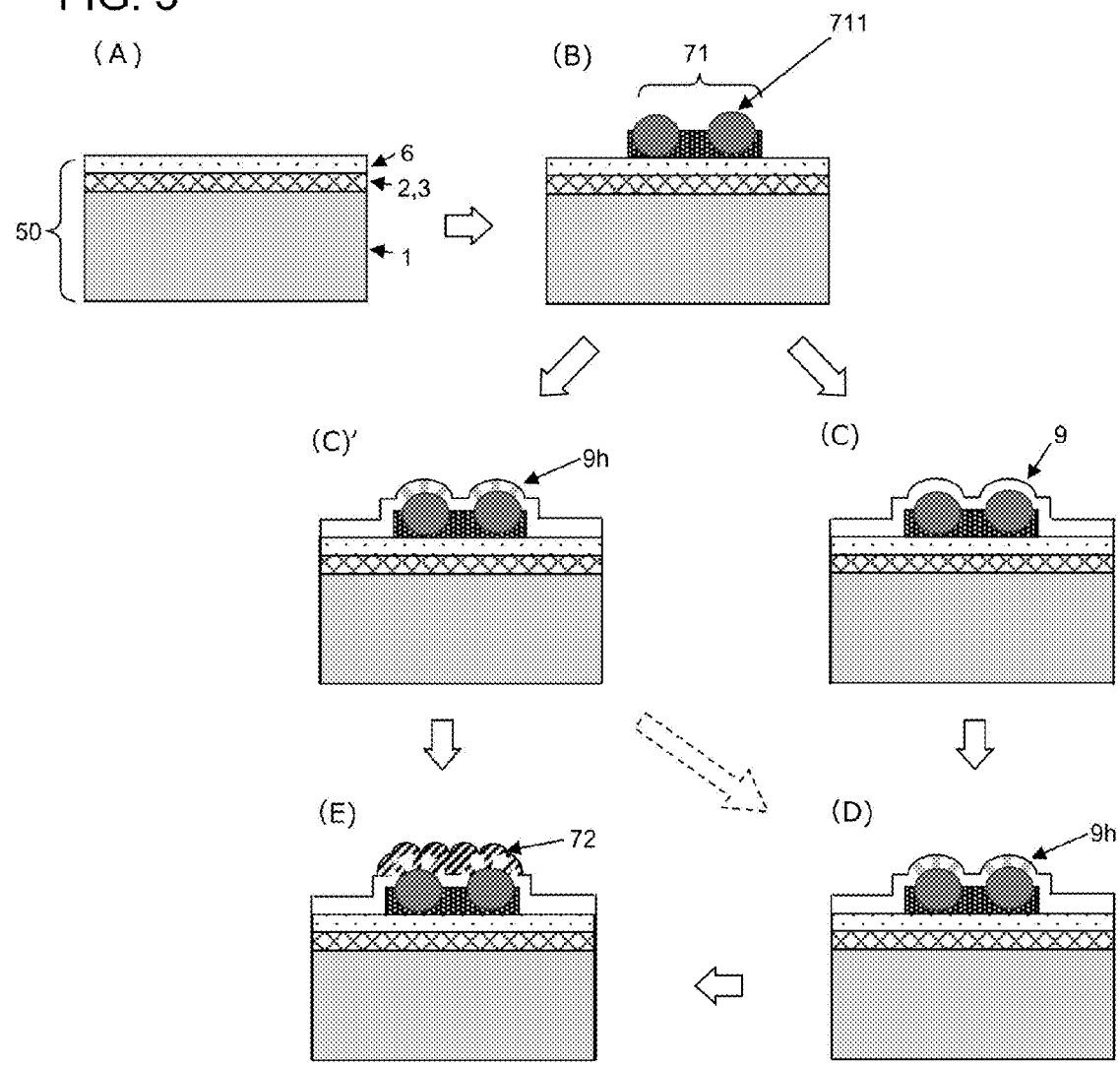
FIG. 3 is a conceptual view of a process of manufacture of a solar cell according to one embodiment of the present invention.

A preferred aspect of a method of manufacture of a collecting electrode in the present invention will be described below based on the drawings. FIG. 3 is a schematic procedural view showing one embodiment of a method for forming a collecting electrode 70 on a photoelectric conversion section 50 of a solar cell. In this embodiment, first, the photoelectric conversion section 50 is provided (a photoelectric conversion section providing step at (A)). For example, in the case of a heterojunction solar cell, a photoelectric conversion section including a silicon-based thin-film and a transparent electrode layer is provided on a silicon substrate of a first conductivity type, as described above.

A first electroconductive layer 71 containing a low-melting-point material 711 is formed on one main surface of the photoelectric conversion section (a first electroconductive layer forming step at (B)). An insulating layer 9 is formed on the first electroconductive layer 71 (an insulating layer forming step at (C) or (C')). The insulating layer 9 may be formed only on the first electroconductive layer 71, or may be formed also on a region on which no first electroconductive layer 71 is formed (first electroconductive layer-non-formed region) in the photoelectric conversion section 50. In particular, when a transparent electrode layer is formed on the surface of the photoelectric conversion section 50 as in the heterojunction solar cell, the insulating layer 9 is preferably formed also on the first electroconductive layer-non-formed region.

In the present invention, an annealing treatment (also referred to as a heating treatment) by heating is performed (1) in the insulating layer forming step or (2) after the insulating layer is formed. The first electroconductive layer 71 is heated to an annealing temperature Ta by the annealing treatment, so that the low-melting-point material is thermally fluidized to thereby change the surface shape, and accordingly the insulating layer 9 formed on the first electroconductive layer 71 is deformed, leading to formation of an opening section 9h. The opening section 9h is formed in the form of, for example, cracks. The "annealing treatment" means a treatment for forming an opening section in an insulating layer unless otherwise specified.

When an annealing treatment is performed in the insulating layer forming step, the opening section 9h is formed almost in parallel with formation of the insulating layer as in FIG. 3 at (C'). When an annealing treatment is performed after the insulating layer forming step, the opening section 9h can be formed as shown at (D) by performing the annealing treatment after the insulating layer 9 is formed as at (C). As indicated by the dashed line arrow in FIG. 3, an annealing treatment (at (C')) may be performed in the insulating layer forming step, followed by further performing an annealing treatment (at (D)).

After forming the opening section in the insulating layer by the annealing treatment, a second electroconductive layer 72 is formed by a plating method (a plating step at (E)). The first electroconductive layer 71 is covered with the insulating layer 9, but in a section, where the opening section 9h is formed in the insulating layer 9, the first electroconductive layer 71 is exposed. Therefore, the first electroconductive layer is exposed to plating solution, so that metal can be deposited at the opening section 9h forming an origination point. According to this method, a second electroconductive layer matching the shape of the collecting electrode can be formed by a plating method without providing a resist material layer having an opening section matching the shape of the collecting electrode.

The first electroconductive layer 71 is a layer that functions as an electroconductive underlying layer when the second electroconductive layer is formed by a plating method. Therefore, it suffices that the first electroconductive layer has such a level of electroconductivity that it can function as an underlying layer for electrolytic plating. In this specification, those having a volume resistivity of $10^{-2}$ Ω·cm or less are defined as being electroconductive. Those having a volume resistivity of $10^2$ Ω·cm or more are defined as insulating.

The surface roughness Ra1 of a surface of the first electroconductive layer, on which the second electroconductive layer is formed, is preferably 1.0 μm or more. When Ra1 is in the aforementioned range, adhesion with the insulating layer or the second electroconductive layer formed on or above the surface can be improved. In the present invention, the second electroconductive layer is formed on the first electroconductive layer with the insulating layer interposed therebetween, and therefore the surface roughness of the insulating layer on the first electroconductive layer may be affected by Ra1. Similarly, Ra2 may be affected by Ra1. Therefore, it is preferred to adjust Ra1 so that Ra2 is in a desired range.

Ra1 is more preferably 2.5 µm or more, further preferably 3.5 µm or more. Ra1 is preferably 10 µm or less, more preferably 9.0 µm or less, further preferably 7.0 µm or less. As described later, the surface roughness Ra2 of the second electroconductive layer formed on the first electroconductive layer is in a range comparable to that for Ra1. Therefore, when Ra1 is in the aforementioned range, adhesion between the second electroconductive layer and the resin adhesive (also referred to as an electroconductive adhesive) can be improved, so that module performance can be further improved. In the present invention, Ra1 can be easily set in the aforementioned range by appropriately adjusting the particle size or content of a low-melting-point material that forms the first electroconductive layer, the type or content of a material other than the low-melting-point material, the viscosity of a paste material for formation of the first electroconductive layer, or the like.

The thickness of the first electroconductive layer 71 is preferably 20 µm or less, more preferably 10 µm or less, in terms of costs. On the other hand, the thickness is preferably 0.5 µm or more, more preferably 1 µm or more, so that the line resistance of the first electroconductive layer 71 falls within a desired range.

The first electroconductive layer 71 contains a low-melting-point material having a thermal-fluidization onset temperature $T_1$. The thermal-fluidization onset temperature is a temperature at which a material is fluidized by heating to change the surface shape of a layer containing a low-melting-point material, and is typically a melting point. As for polymer materials and glass, a material may be softened to be thermally fluidized at a temperature lower than the melting point. In these materials, the thermal-fluidization onset temperature can be defined as being equal to a softening point. The softening point is a temperature at which the viscosity is $4.5 \times 10^6$ Pa·s (the same as the definition for the softening point of glass).

The low-melting-point material is preferably thermally fluidized in the annealing treatment, thus causing a change in surface shape of the first electroconductive layer 71. Therefore, the thermal-fluidization onset temperature $T_1$ of the low-melting-point material is preferably lower than an annealing temperature Ta. In the present invention, the annealing treatment is preferably carried out at the annealing temperature Ta that is lower than the heat-resistant temperature of the photoelectric conversion section 50. Therefore, the thermal-fluidization onset temperature $T_1$ of the low-melting-point material is preferably lower than the heat-resistant temperature of the photoelectric conversion section.

The heat-resistant temperature of the photoelectric conversion section is a temperature at which characteristics of a solar cell module prepared using a solar cell (also referred to as a "cell") or a solar cell including the photoelectric conversion section are irreversibly reduced. For example, in the heterojunction solar cell 101 shown in FIG. 2, the single-crystal silicon substrate 1 that forms the photoelectric conversion section 50 hardly undergoes a change in characteristics even when heated to a high temperature of 500° C. or higher, but the transparent electrode layer 6 and amorphous silicon-based thin-films 2 and 3 may undergo thermal degradation or diffusion of dope impurities when heated to about 250° C., thus causing an irreversible reduction in the solar cell characteristics. Therefore, in the heterojunction solar cell, the first electroconductive layer 71 preferably contains a low-melting-point material having a thermal-fluidization onset temperature $T_1$ of 250° C. or lower.

The lower limit of the thermal-fluidization onset temperature $T_1$ of the low-melting-point material is not particularly limited. The low-melting-point material is preferably not thermally fluidized in the step of forming the first electroconductive layer, so that an amount of surface shape change of the first electroconductive layer in the annealing treatment is increased to form the opening section 9h in the insulating layer 9 easily. For example, when the first electroconductive layer is formed by coating or printing, heating may be carried out for drying. In this case, the thermal-fluidization onset temperature $T_1$ of the low-melting-point material is preferably higher than the temperature of heating for drying the first electroconductive layer. Accordingly, the thermal-fluidization onset temperature $T_1$ of the low-melting-point material is preferably 80° C. or higher, more preferably 100° C. or higher.

The low-melting-point material may be an organic substance or an inorganic substance as long as the thermal-fluidization onset temperature $T_1$ falls within the aforementioned range. The low-melting-point material may be electroconductive or insulating, but is desired to be a metallic material that has electroconductivity. If the low-melting-point material is a metallic material, the resistance value of the first electroconductive layer can be decreased, so that uniformity of the thickness of the second electroconductive layer can be improved when the second electroconductive layer is formed by electroplating. If the low-melting-point material is a metallic material, the contact resistance between the photoelectric conversion section 50 and the collecting electrode 70 can also be reduced.

As the low-melting-point material, a low-melting metallic material alone or an alloy thereof, or a mixture of a plurality of low-melting metallic materials can be suitably used. Examples of the low-melting metallic material include indium, bismuth, and gallium.

Figure 4:
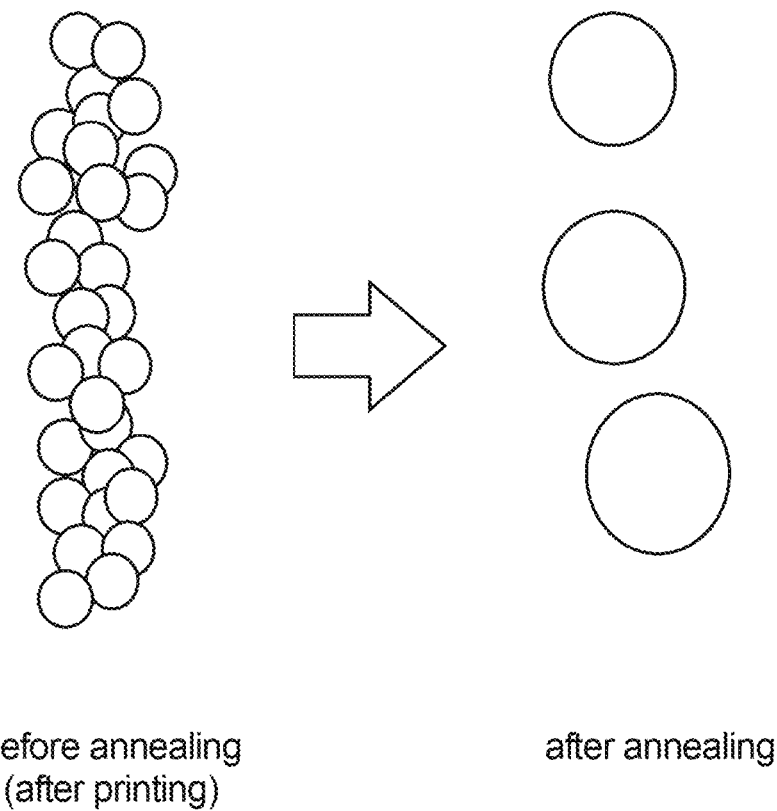
FIG. 4 is a conceptual view showing one example of a shape change of a low-melting-point material during heating.

The first electroconductive layer 71 preferably contains, in addition to the aforementioned low-melting-point material, high-melting-point material having thermal-fluidization onset temperature $T_2$ that is relatively higher than the thermal-fluidization onset temperature of the low-melting-point material. When the first electroconductive layer 71 includes a high-melting-point material, a conductive connection can be efficiently established between the first electroconductive layer and the second electroconductive layer, so that conversion efficiency of the solar cell can be improved. For example, when a material with high surface energy is used as the low-melting-point material, the first electroconductive layer 71 is exposed to a high temperature in the annealing treatment, the low-melting-point material is thereby brought into liquid phase state and as a result, as shown conceptually in FIG. 4, particles of the low-melting-point material aggregate into coarse particles, so that disconnecting occurs in the first electroconductive layer 71 in some cases. In contrast, the high-melting-point material is not brought into a liquid phase state by heating in the annealing treatment, and therefore by including the high-melting-point material in the first electroconductive layer forming material, disconnecting of the first electroconductive layer by coarsening of the low-melting-point material as shown in FIG. 4 can be suppressed.

The thermal-fluidization onset temperature $T_2$ of the high-melting-point material is preferably higher than the annealing temperature Ta. That is, when the first electroconductive layer 71 contains the low-melting-point material and the high-melting-point material, the thermal-fluidization onset temperature $T_1$ of the low-melting-point material, the thermal-fluidization onset temperature $T_2$ of the high-meltingpoint material and the annealing temperature Ta in the annealing treatment preferably satisfy $T_1<Ta<T_2$. The high-melting-point material may be an insulating material or an electroconductive material, but is preferably an electroconductive material in order to reduce the resistance of the first electroconductive layer. When the electroconductivity of the low-melting-point material is low, the overall resistance of the first electroconductive layer can be reduced by using a material having high electroconductivity as the high-melting-point material. As the electroconductive high-melting-point material, for example, a metallic material alone such as silver, aluminum or copper, or a plurality of metallic materials can be suitably used.

When the first electroconductive layer 71 contains the low-melting-point material and the high-melting-point material, the content ratio thereof is appropriately adjusted from the viewpoints of suppression of disconnecting by coarsening of the low-melting-point material as described above, the electroconductivity of the first electroconductive layer, ease of forming an opening section in the insulating layer (increase of the number of origination points for metal deposition on the second electroconductive layer), and so on. The optimum value of the content ratio varies depending on combinations of materials and particle sizes used, but for example, the weight ratio between the low-melting-point material and the high-melting-point material (low-melting-point material high-melting-point material) is set to be in a range of 5:95 to 67:33.

The weight ratio between the low-melting-point material: the high-melting-point material is more preferably set to be from 10:90 to 50:50, further preferably set to be from 15:85 to 35:65.

When a particulate low-melting-point material such as metal particles is used as a material of the first electroconductive layer 71, the particle size $D_L$ of the low-melting-point material is preferably no less than 1/20, more preferably no less than 1/10, of the thickness d of the first electroconductive layer, so that a formation of an opening in the insulating layer by the annealing treatment is facilitated. The particle size $D_L$ of the low-melting-point material is preferably 0.25 μm or more, more preferably 0.5 μm or more. When the first electroconductive layer 71 is formed by a printing method such as screen printing, the particle size of particles can be appropriately set according to, for example, the mesh size of a screen plate. For example, the particle size is preferably smaller than the mesh size, more preferably no more than ½ of the mesh size. When particles are non-spherical, the particle size is defined by the diameter of a circle having an area equal to the projected area of particles (projected area-circle equivalent diameter, Heywood diameter).

The shape of particles of the low-melting-point material is not particularly limited, but is preferably a non-spherical shape such as a flat shape. Non-spherical particles formed by binding spherical particles together by a method such as sintering are also suitably used. In general, when metal particles are brought into a liquid phase state, the surface shape tends to be spherical for reducing surface energy. If the low-melting-point material of the first electroconductive layer before carrying out the annealing treatment is non-spherical, the amount of change in surface shape of the first electroconductive layer is larger because particles become more spherical when heated to the thermal-fluidization onset temperature $T_1$ or higher in the annealing treatment. Therefore, it becomes easy to form an opening section in the insulating layer 9 on the first electroconductive layer 71.

As described above, the first electroconductive layer 71 shows electroconductivity, and it suffices that its volume resistivity is $10^{-2}$ Ω·cm or less. The volume resistivity of the first electroconductive layer 71 is preferably $10^{-4}$ Ω·cm or less. When the first electroconductive layer has only the low-melting-point material, it suffices that the low-melting-point material has electroconductivity. When the first electroconductive layer contains the low-melting-point material and the high-melting-point material, it suffices that at least either one of the low-melting-point material and the high-melting-point material has electroconductivity. Examples of the combination of the low-melting-point material/high-melting-point material include: insulating material/electroconductive material; electroconductive material/insulating material; and electroconductive material/electroconductive material. In order to make the first electroconductive layer less resistive, it is preferable that both the low-melting-point material and high-melting-point material be electroconductive materials.

Besides using the combination of the low-melting-point material and the high-melting-point material described above as the material of the first electrically conductive layer 71, conversion efficiency may also be improved by adjusting the size of materials (e.g. particle size) and the like to suppress the disconnecting of the first electroconductive layer due to heating in the annealing treatment. For example, even a material having a high melting point, e.g. silver, copper or gold, in the form of fine particles having a particle size of 1 μm or less, undergoes sintering-necking (fusion of fine particles) at a temperature lower than the melting point, i.e. about 200° C., or a lower temperature $T_1'$, and therefore can be used as the "low-melting-point material" of the present invention. When heated to the sintering-necking onset temperature $T_1'$ or higher, the material that undergoes sintering-necking is deformed at and near the outer periphery of fine particles, so that the surface shape of the first electroconductive layer can be changed to form an opening section in the insulating layer 9. Even when fine particles are heated to the sintering-necking onset temperature or higher, the fine particles retains a solid phase state at any temperature that is lower than a melting point $T_2'$, and therefore disconnecting by coarsening of the material as shown in FIG. 4 hardly occurs. In this respect, it can be said that the material that undergoes sintering-necking, such as metal fine particles, has an aspect of the "high-melting-point material" as well while being the "low-melting-point material" in the present invention.

Figure 5A:
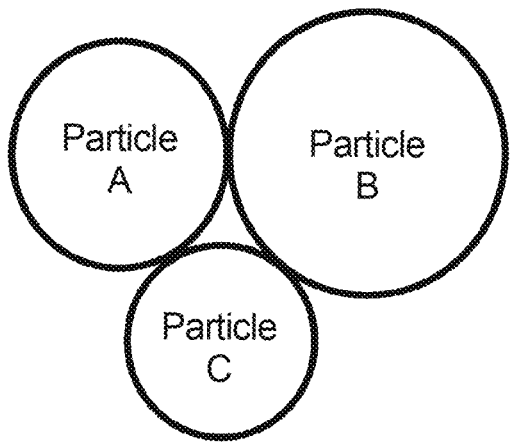
FIGS. 5(A)-(C) are conceptual views for explaining a shape change and necking of a low-melting-point material powder during heating.
Figure 5B:
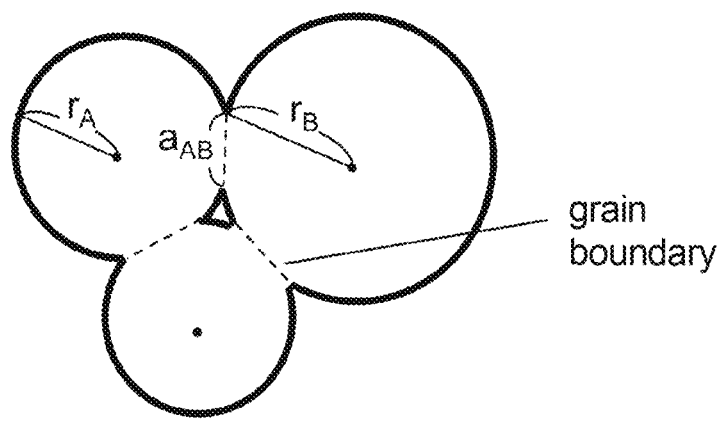
Figure 5C:
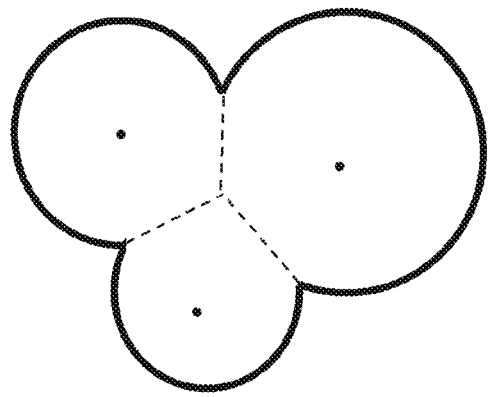

In the material that undergoes sintering-necking, the sintering-necking onset temperature T1' can be defined as being equal to a thermal-fluidization onset temperature T1. FIGS. 5(A)-(C) are views for explaining the sintering-necking onset temperature. FIG. 5(A) is a plan view schematically showing particles before sintering. Particles contact one another at points because they are particles before sintering. FIGS. 5(B) and 5(C) are sectional views each schematically showing a state when particles after the onset of sintering are cut along a cross section that passes through the center of each particle. FIG. 5(B) shows particles after the onset of sintering (initial sintering stage), and FIG. 5(C) shows a state in which the particles of FIG. 5(B) are further sintered. In FIG. 5(B), the grain boundary between a particle A (radius: rA) and a particle B (radius: rB) is shown by a dotted line segment (length: aAB).

Figure 6A:
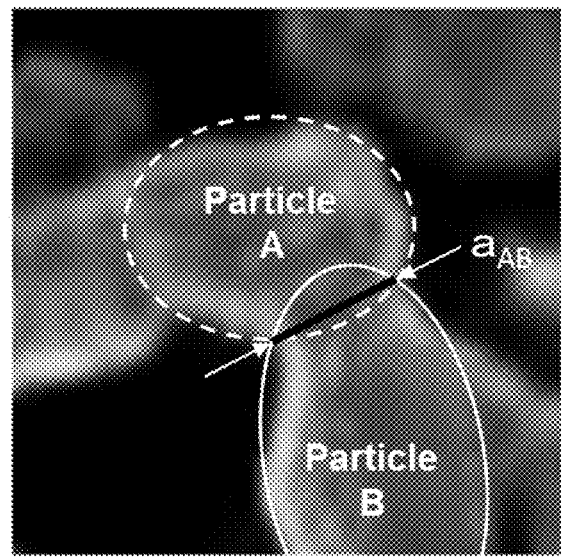
FIGS. 6(A) and (B) are SEM photographs of metal fine particles in which sintering-necking occurs.
Figure 6B:
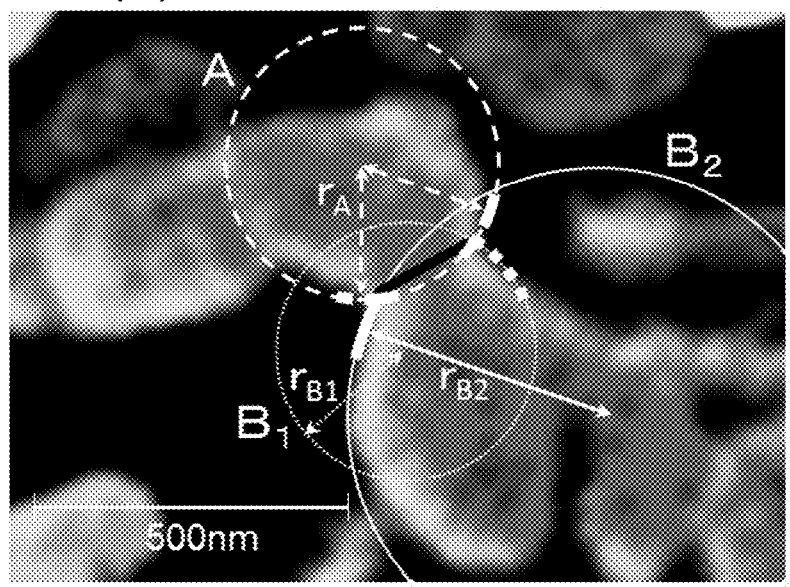

The sintering-necking onset temperature $T_1'$ is defined by a temperature at which the ratio of the length $a_{AB}$ of the grain boundary to max $(r_A, r_B)$, that is the larger of $r_A$ and $r_B$, $a_{AB}$/max $(r_A, r_B)$, is 0.1 or more. That is, the temperature, at which $a_{AB}/\max(r_A, r_B)$ of at least a pair of particles is 0.1 or more, is referred to as a sintering-necking onset temperature. In FIGS. 5(A)-(C), particles are shown as being spherical for simplification, but when particles are not spherical, the curvature radius of a particle near the grain boundary is considered as the radius of the particle. When the curvature radius of the particle near the grain boundary varies depending on the location, the largest curvature radius among measurement points is considered as the radius of the particle. For example, as shown in FIG. 6(A), a grain boundary having a length of $a_{AB}$ is formed between a pair of fine particles A and B that undergo sintering. In this case, the shape of the particle A near the grain boundary is approximated by the arc of an imaginary circle A shown in a dashed line. On the other hand, for the shape of the particle B near the grain boundary, one is approximated by the arc of an imaginary circle $B_1$ shown in a dotted line, and the other is approximated by the arc of an imaginary circle $B_2$ shown in a solid line. As shown in FIG. 6(B), $r_{B2}$ is larger than $r_{B1}$, and therefore $r_{B2}$ is considered as the radius $r_B$ of the particle B. The aforementioned imaginary circle can be determined by a method in which a boundary is defined by monochromatic binarization processing of an observed image at the cross section or the surface, and central coordinates and a radius are calculated by a least square method based on the coordinates of the boundary near the grain boundary. When it is difficult to accurately measure the sintering-necking onset temperature based on the aforementioned definition, a first electroconductive layer containing fine particles is formed, and a temperature, at which an opening section is formed in the insulating layer by annealing when forming an insulating layer thereon or by annealing after forming an insulating layer, can be considered as a sintering-necking onset temperature.

For the material forming the first electroconductive layer, a paste or the like containing a binder resin or the like can be suitably used, besides the aforementioned low-melting-point material (and the high-melting-point material). For sufficiently improving the electroconductivity of the first electroconductive layer formed by a screen printing method, it is desirable to cure the first electroconductive layer by a heat treatment. Therefore, for the binder resin contained in the paste, a material that can be cured at the aforementioned drying temperature is preferably used, and an epoxy-based resin, a phenol-based resin, an acrylic resin and the like are applicable. This is because in this case, the shape of the low-melting-point material is changed as it is cured, and as shown in FIG. 3 at (D), an opening (cracks) is easily generated in the insulating layer near the low-melting-point material in the annealing treatment. It suffices that the ratio between the binder resin and the electroconductive low-melting-point material is set so as to be equal to or more than the so-called percolation threshold (a critical value of a ratio corresponding to the low-melting-point material content at which electroconductivity is exhibited).

The first electroconductive layer 71 can be prepared by a known technique such as an inkjet method, a screen printing method, a conductor wire bonding method, a spray method, a vacuum deposition method, or a sputtering method. The first electroconductive layer 71 is preferably patterned in a specific shape such as a comb-like pattern. For formation of the patterned first electroconductive layer, the screen printing method is suitable to increase productivity. For the screen printing method, a method is suitably used in which a collecting electrode pattern is printed using a printing paste containing a low-melting-point material made of metal particles and a screen plate having an opening pattern matching the pattern shape of the collecting electrode.

On the other hand, when a material containing a solvent is used as a printing paste, a drying step for removing the solvent is required. As described previously, the drying temperature in this case is preferably lower than the thermal-fluidization onset temperature $T_1$ of the low-melting-point material. The drying time can be appropriately set at, for example, about 5 minutes to 1 hour.

Ra1 can be easily set in a specific range by appropriately adjusting the material or particle size of the low-melting-point material, or the like, as described above. For example, when a paste material is used for formation of the first electroconductive layer, the viscosity of the paste material is preferably 20 Pa·s or more and 500 Pa·s or less. When the viscosity of the paste material is in the aforementioned range, Ra1 of the first electroconductive layer can be easily set in a specific range. When the viscosity of the paste material is 20 Pa·s or more, a ratio of the thickness to the line width (aspect ratio) in the first electroconductive layer can be increased, so that a light-shielding loss or line resistance can be reduced. The viscosity of the paste material is more preferably 50 Pa·s or more, especially preferably 80 Pa·s or more. The viscosity of the paste material is preferably 500 Pa·s or less, more preferably 400 Pa·s or less, especially preferably 300 Pa·s or less for improving contact with the transparent electroconductive layer.

The first electroconductive layer may be composed of a plurality of layers. The first electroconductive layer may have, for example, a layered structure composed of a lower layer having a low contact resistance with a transparent electrode layer on the surface of a photoelectric conversion section and an upper layer containing a low-melting-point material. According to this structure, it can be expected that the fill factor of the solar cell is improved as contact resistance with the transparent electrode layer decreases. It can be expected that the first electroconductive layer is made still less resistive by forming a layered structure of a layer with low-melting-point material and a layer with high-melting-point material.

Explanations have been provided above principally for the case of forming the first electroconductive layer by a printing method, but the method for forming the first electroconductive layer is not limited to the printing method. For example, the first electroconductive layer may be formed by a deposition method or a sputtering method using a mask matching the pattern shape.

(Insulating Layer)

The insulating layer 9 is formed on the first electroconductive layer 71. Here, when the first electroconductive layer 71 is formed in a specific pattern (e.g. a comb-like pattern), the surface of the photoelectric conversion section 50 has a first electroconductive layer-formed region where the first electroconductive layer is formed, and a first electroconductive layer-non-formed region where no first electroconductive layer is formed.

The insulating layer 9 is formed at least on the first electroconductive layer-formed region. The insulating layer 9 may also contribute to improvement of adhesive strength between the first electroconductive layer 71 and the second electroconductive layer 72. Generally, a thinned collecting electrode is preferably used for reducing a light-shielding loss caused by the collecting electrode. When the collecting electrode is thinned, the adhesion strength tends to be reduced as the contact area decreases, and therefore it is desirable to further improve adhesion between the first electroconductive layer and the second electroconductive layer.

In the present invention, it is considered that by forming an insulating layer between the first electroconductive layer and the second electroconductive layer and setting Ra1 of the first electroconductive layer in a specific range, an irregularity structure can be easily formed on a surface of the insulating layer on the second electroconductive layer side, so that adhesion with the second electroconductive layer formed on the surface is improved. As a result, even when the collecting electrode is thinned, an effect of preventing peeling between the first electroconductive layer and the second electroconductive layer can be expected. Consequently, improvement of the yield (effect from prevention of peeling), reduction of a light-shielding loss (effect from thinning), and the like can be expected.

For example, when an Ag layer or the like is used as the first electroconductive layer and a Cu layer is formed thereon by a plating method, the adhesion strength between the Ag layer and the Cu layer is low. On the other hand, when a Cu layer is formed on an insulating layer of silicon oxide or the like, the adhesion strength of the second electroconductive layer is increased, so that improvement of the reliability of the solar cell can be expected.

In the present invention, the insulating layer 9 is preferably formed on the first electroconductive layer-non-formed region as well, and is especially preferably formed on the entire surface of the first electroconductive layer-non-formed region. When the insulating layer is also formed on the first electroconductive layer-non-formed region as well, the photoelectric conversion section can be chemically and electrically protected from a plating solution when the second electroconductive layer is formed by a plating method. For example, when a transparent electrode layer is formed on the surface of the photoelectric conversion section 50 as in a heterojunction solar cell, by formation of the insulating layer on the surface of the transparent electrode layer, contact of the transparent electrode layer with a plating solution is suppressed, so that deposition of a metallic layer (second electroconductive layer) onto the transparent electrode layer can be prevented. The insulating layer is more preferably formed on the entire first electroconductive layer-formed region and first electroconductive layer-non-formed region to increase productivity. In this case, the boundary portion between the first electroconductive layer-formed region and the first electroconductive layer-non-formed region is covered with the insulating layer as a continuous film, and therefore even when the first electroconductive layer is thinned, peeling of the first electroconductive layer from the substrate is prevented, so that a yield improving effect can be expected.

As the material of the insulating layer 9, a material that is electrically insulating is used. It is desirable that the insulating layer 9 be a material having chemical stability with a plating solution. By using a material having high chemical stability with a plating solution, the insulating layer is hardly dissolved in a plating step during formation of the second electroconductive layer, so that damage to the surface of the photoelectric conversion section is hindered. When the insulating layer 9 is formed on the first electroconductive layer-non-formed region as well, the insulating layer preferably has high adhesive strength with the photoelectric conversion section 50. For example, in the heterojunction solar cell, the insulating layer 9 preferably has high adhesive strength with the transparent electrode layer 6a on the surface of the photoelectric conversion section 50. By increasing adhesive strength between the transparent electrode layer and the insulating layer, the insulating layer becomes hard to peel off during the plating step, so that deposition of a metal onto the transparent electrode layer can be prevented.

For the insulating layer 9, a material having low optical absorption is preferably used. The insulating layer 9 is formed on the light incident surface side of the photoelectric conversion section 50, and therefore if optical absorption by the insulating layer is low, a larger amount of light can be introduced into the photoelectric conversion section. For example, when the insulating layer 9 has sufficient transparency with a transmittance of 90% or more, the optical loss at the insulating layer by optical absorption is low, the solar cell can be provided for a practical use without removing the insulating layer after forming the second electroconductive layer. Consequently, the process for manufacturing the solar cell can be simplified, so that productivity can be further improved. When a solar cell is provided for a practical use without removing the insulating layer 9, it is desirable that a material having sufficient weather resistance and stability to heat/humidity in addition to transparency is used for forming the insulating layer 9.

The material of the insulating layer may be an inorganic insulating material or an organic insulating material. As the inorganic insulating material, a material such as silicon oxide, silicon nitride, titanium oxide, aluminum oxide, magnesium oxide, or zinc oxide can be used. As the organic insulating material, a material such as polyester, an ethylene-vinyl acetate copolymer, acrylic, epoxy, or polyurethane can be used. The material of the insulating layer is preferably an inorganic material having a low elongation at break, so that a formation of an opening in the insulating layer, which occurs as the surface shape of the first electroconductive layer changes by stress or the like at the interface, in the annealing treatment is facilitated.

Among these inorganic materials, silicon oxide, silicon nitride, silicon oxynitride, aluminum oxide, sialon (SiAlON), yttrium oxide, magnesium oxide, barium titanate, samarium oxide, barium tantalate, tantalum oxide, magnesium fluoride, titanium oxide, strontium titanate, or the like is suitably used in view of resistance to a plating solution and transparency of the material. Above all, silicon oxide, silicon nitride, silicon oxynitride, aluminum oxide, sialon (SiAlON), yttrium oxide, magnesium oxide, barium titanate, samarium oxide, barium tantalate, tantalum oxide, magnesium fluoride, or the like is preferable from the viewpoints of electrical characteristics, adhesiveness with the transparent electrode layer, and so on, and silicon oxide, silicon nitride, or the like is especially suitably used to adjust the refractive index appropriately. These inorganic materials are not limited to those having a stoichiometric composition, but may be those having oxygen deficiencies.

The thickness of the insulating layer 9 may be set appropriately, according to the material of the insulating layer and method of formation thereof. The thickness of the insulating layer 9 is preferably so thin that an opening section can be formed in the insulating layer by stress or the like at the interface, which occurs as the surface shape of the first electroconductive layer is changed in the annealing treatment. Accordingly, the thickness of the insulating layer 9 is preferably 1000 nm or less, more preferably 500 nm or less. By appropriately setting the optical characteristics and thickness of the insulating layer 9 in a first electroconductive layer-non-formed region, light reflection characteristics are improved, and the amount of light introduced into the solar cell is increased, so that conversion efficiency can be further improved. In order to obtain this effect, the refractive index of the insulating layer 9 is preferably lower than the refractive index of the surface of the photoelectric conversion section 50. In order to impart suitable antireflection characteristics to the insulating layer 9, the thickness is preferably set within a range of 30 nm to 250 nm, and more preferably set within a range of 50 nm to 250 nm. The thickness of the insulating layer on the first electroconductive layer-formed region and the thickness of the insulating layer on the first electroconductive layer-non-formed region may be mutually different. For example, the thickness of the insulating layer may be set so as to facilitate a formation of an opening section by the annealing treatment as to the first electroconductive layer-formed region, and the thickness of the insulating layer may be set so as to have an optical thickness with appropriate antireflection characteristics as to the first electroconductive layer-non-formed region.

When a transparent electrode layer (the refractive index of which is generally about 1.9 to 2.1) is provided on the surface of the photoelectric conversion section 50 as in the heterojunction solar cell, the refractive index of the insulating layer is preferably an intermediate value between the refractive index of air (1.0) and the refractive index of the transparent electrode layer to enhance an anti-reflection effect at the interfaces, thereby increasing an amount of light introduced into the solar cell. When the solar cells are sealed to be modularized, the refractive index of the insulating layer is preferably an intermediate value between the refractive index of a sealing material and the refractive index of the transparent electrode layer. Accordingly, the refractive index of the insulating layer 9 is, for example, preferably 1.4 to 1.9, more preferably 1.5 to 1.8, further preferably 1.55 to 1.75. The refractive index of the insulating layer can be adjusted to fall within a desired range according to the material, composition, and the like of the insulating layer. For example, in the case of silicon oxide, the refractive index is increased by decreasing the oxygen content. Unless otherwise specified, the refractive index in this specification is a refractive index to light having a wavelength of 550 nm and a value measured by spectroscopic ellipsometry. The optical thickness (refractive index×thickness) of the insulating layer is preferably set according to the refractive index of the insulating layer so that anti-reflection characteristics are improved.

The insulating layer can be formed using a known method. For example, in the case of an inorganic insulating material such as silicon oxide or silicon nitride, a dry process such as a plasma-enhanced CVD method or a sputtering method is suitably used. In the case of an organic insulating material, a wet process such as a spin coating method or a screen printing method is suitably used. By these methods, a film of a densified structure having reduced defects such as pinholes can be formed.

Above all, the insulating layer 9 is preferably formed by the plasma-enhanced CVD method so as to form a film having a more densified structure. By this method, a film having a structure with high density can be formed even when an insulating layer having a small thickness of about 30 to 100 nm, as well as a large thickness of about 200 nm, is formed.

For example, when the photoelectric conversion section 50 has on its surface a textured structure (uneven structure) as in the heterojunction solar cell shown in FIG. 2, the insulating layer is preferably formed by the plasma-enhanced CVD method so that a film may be formed with high accuracy even at recessed and raised portions of the texture. By using an insulating layer having high density, damage to the transparent electrode layer during a plating treatment can be reduced, and also deposition of a metal onto the transparent electrode layer can be prevented. Thus, the insulating layer having high density can function as a bather layer to water, oxygen, and the like for a layer within the photoelectric conversion section 50, like the silicon-based thin-film 3a in the heterojunction solar cell in FIG. 2, so that an effect of improving long-term reliability of the solar cell can also be expected.

The shape of the insulating layer 9 present between the first electroconductive layer 71 and the second electroconductive layer 72, i.e. the insulating layer 9 on the first electroconductive layer-formed region, does not have to be necessarily a seamless layer, but may be an island layer. The term "island" in this specification means a state in which a non-formed region, on which no insulating layer 9 is formed, is provided at a part of the surface.

In the present invention, the annealing treatment is performed when the insulating layer 9 is formed on the first electroconductive layer 71, or after the insulating layer is formed and before the second electroconductive layer 72 is formed. In the annealing treatment, the first electroconductive layer 71 is heated to a temperature higher than the thermal-fluidization onset temperature $T_1$ of the low-melting-point material, and the low-melting-point material is fluidized, so that the surface shape of the first electroconductive layer is changed. In association with this change, the opening section 9h is formed in the insulating layer 9 on the first electroconductive layer. Therefore, in the subsequent plating step, a part of the surface of the first electroconductive layer 71 is exposed to a plating solution for conducting electricity, thus making it possible to deposit a metal on the conducting part as an origination point as shown in FIG. 3 at (E).

The opening section is formed principally on the low-melting-point material 711 of the first electroconductive layer 71. When the low-melting-point material is an insulating material, a part immediately below the opening section is insulating, but a plating solution also penetrates into the electroconductive high-melting-point material present on the periphery of the low-melting-point material, and therefore a conductive connection can be established between the first electroconductive layer and the plating solution.

The annealing temperature (heating temperature) Ta in the annealing treatment is preferably higher than the thermal-fluidization onset temperature $T_1$ of the low-melting-point material, i.e. $T_1<Ta$. The annealing temperature Ta more preferably satisfies $T_1+1°$ C.$\leq$Ta$\leq T_1+100°$ C., and further preferably satisfies $T_1+5°$ C.$\leq$Ta$\leq T_1+60°$ C. The annealing temperature can be appropriately set according to the composition and content of the material of the first electroconductive layer, and so on.

The annealing temperature Ta is preferably lower than the heat-resistant temperature of the photoelectric conversion section 50 as described above. The heat-resistant temperature of the photoelectric conversion section varies depending on the configuration of the photoelectric conversion section. For example, when a transparent electrode layer and an amorphous silicon-based thin-film are provided as in the heterojunction solar cell or the silicon-based thin-film solar cell, the heat-resistant temperature is about 250° C. Thus, in the case of the heterojunction solar cell or the silicon-based thin-film solar cell, in which the photoelectric conversion section includes an amorphous silicon-based thin-film, the annealing temperature is preferably set at 250° C. or lower so that thermal damage at the amorphous silicon-based thin-film and the interface thereof are suppressed. For achieving a solar cell having higher performance, the annealing temperature is more preferably 200° C. or lower, further preferably 180° C. or lower.

In association therewith, the thermal-fluidization onset temperature $T_1$ of the low-melting-point material of the first electroconductive layer 71 is preferably lower than 250° C., more preferably lower than 200° C., further preferably lower than 180° C.

In the present invention, an annealing treatment by heating is performed during the insulating layer forming step or after the insulating layer is formed as described above. In the insulating layer forming step, the insulating layer is formed while the substrate is heated at the annealing temperature Ta, so that an opening section is formed almost in parallel to formation of the insulating layer. The phrase "almost in parallel to formation of the insulating layer" means a state which is before another step is performed and after the insulating layer forming step, i.e., a state during formation of the insulating layer or immediately after formation of the insulating layer. For example, a case is included where an opening section is formed after formation of the insulating layer is completed (after heating is stopped) and before the substrate surface temperature returns to room temperature. When an opening section is formed in the insulating layer on a low-melting-point material, the phrase "the opening section is formed almost in parallel to formation of the insulating layer" includes a case where an opening is formed in the insulating layer on the low-melting-point material following formation of the insulating layer on the periphery of the low-melting-point material even after formation of the insulating layer on the low-melting-point material is completed.

The "annealing temperature Ta" in the present invention means a substrate surface temperature (substrate heating temperature) during an annealing treatment. When an annealing treatment is performed in the insulating layer forming step, the annealing temperature Ta is a temperature at the start of formation of the insulating layer. The average value of the substrate surface temperature during formation of the insulating layer is usually equal to or higher than the substrate surface temperature at the start of formation of the insulating layer. Therefore, an opening section can be formed in the insulating layer in the insulating layer forming step as long as the temperature at the start of formation of the insulating layer is higher than $T_1$.

For example, when the insulating layer 9 is formed by a dry method, an opening section can be formed by ensuring that the substrate surface temperature during formation of the insulating layer is higher than the thermal-fluidization onset temperature $T_1$ of the low-melting-point material. When the insulating layer 9 is formed by a wet method, an opening section can be formed by ensuring that the substrate surface temperature at the time of drying a solvent to form a film is higher than the thermal-fluidization onset temperature $T_1$. When the insulating layer is formed by a wet method, the "start of formation" means the start of drying a solvent.

For example, the substrate surface temperature can be measured with a temperature indicating material (also called a thermo label or thermo seal) or a thermocouple attached to the substrate surface. The temperature of a heating section (heater or the like) can be appropriately adjusted so that the surface temperature of the substrate is in a specific range.

When an annealing treatment is performed in the insulating layer forming step, an opening section can be formed in the insulating layer by appropriately adjusting the material and composition of the insulating layer and film formation conditions (film formation method, substrate temperature, type and introduction amount of introduced gas, film formation pressure, power density, and the like). When silicon oxide is formed as the insulating layer, it is preferred to form a film by plasma-enhanced CVD. Preferably, the substrate temperature is 145° C. to 250° C., the pressure is 30 Pa to 300 Pa, and the power density is 0.01 W/cm$^2$ to 0.160 W/cm$^2$ as film formation conditions.

Even when an annealing treatment is performed to form an opening section in the insulating layer in the insulating layer forming step, an annealing treatment may be further performed after the insulating layer forming step and before the plating step. For example, even when formation of an opening by annealing in the insulating layer forming step is insufficient, an opening section can be reliably formed by further performing an annealing treatment after formation of the insulating layer. Even when an opening is not formed in the insulating layer forming step, an opening section can be formed by performing an annealing treatment after the insulating layer forming step and before the plating step.

On the other hand, a crystalline silicon solar cell having a diffusion layer of an opposite conductivity type on one main surface of a crystalline silicon substrate of a first conductivity type has neither an amorphous silicon thin-film nor a transparent electrode layer, and therefore shows a heat-resistant temperature of about 800° C. to 900° C. Thus, the annealing treatment may be carried out at an annealing temperature Ta higher than 250° C.

After the opening section is formed by the annealing treatment, the second electroconductive layer 72 is formed on the insulating layer 9 of the first electroconductive layer-formed region by a plating method. At this time, the metal deposited as the second electroconductive layer is not particularly limited as long as it is a material that can be formed by a plating method, and for example, copper, nickel, tin, aluminum, chromium, silver, zinc, lead, palladium, or the like, or a mixture thereof can be used.

Preferably, the second electroconductive layer has a surface roughness Ra2 of 1.0 μm or more and 10.0 μm or less. When Ra2 is in the aforementioned range, adhesion between the collecting electrode and the resin adhesive in modularization of the solar cell is improved, so that reliability can be enhanced. Ra2 is more preferably 2.0 μm or more, further preferably 3.0 μm or more. Ra2 is preferably 10.0 μm or less, more preferably 8.0 μm or less, further preferably 6.0 μm or less.

The method for adjusting Ra2 within the aforementioned range is not particularly limited, and examples include a method of adjusting the irregularity shape of the surface of a layer formed under the second electroconductive layer, a method of adjusting conditions for formation of the second electroconductive layer, and a mechanical polishing method. Among them, the method of adjusting the irregularity shape of the surface of a layer formed under the second electroconductive layer is preferred because damage to the solar cell can be suppressed.

As described above, the surface roughness Ra2 of the second electroconductive layer is affected by the surface roughness of the insulating layer formed under the second electroconductive layer. The surface roughness of the insulating layer is affected by the surface roughness Ra1 of the first electroconductive layer formed under the insulating layer. Therefore, by adjusting Ra1, the surface roughness of the insulating layer can be adjusted, and Ra2 can be accordingly adjusted within a specific range. Therefore, as described above, Ra1 is preferably 1.0 µm to 10.0 µm, more preferably 2.5 µm to 9.0 µm, further preferably 3.5 µm to 7.0 µm.

As described above, when both Ra1 and Ra2 are 1.0 µm or more and 10.0 µm or less, adhesion (contact) between the second electroconductive layer and a resin adhesive formed thereon can be improved while adhesion between the first electroconductive layer and the second electroconductive layer can be improved. Consequently, a solar cell having high conversion efficiency and high reliability can be prepared.

Electric current principally passes through the second electroconductive layer during operation (electricity generation) of the solar cell. Thus, the line resistance of the second electroconductive layer is preferably as low as possible so as to suppress the resistance loss in the second electroconductive layer. Specifically, the line resistance of the second electroconductive layer is preferably 1 Ω/cm or less, more preferably 0.5 Ω/cm or less. On the other hand, it suffices that the line resistance of the first electroconductive layer is so low that the layer can function as an underlying layer at the time of electroplating, with an example thereof being 5 Ω/cm or less.

The second electroconductive layer can be formed by either of an electroless plating method and an electrolytic plating method, but the electrolytic plating method is suitably used in order to increase productivity. In the electrolytic plating method, the rate of deposition of a metal can be increased, so that the second electroconductive layer can be formed in a short time.

Figure 10:
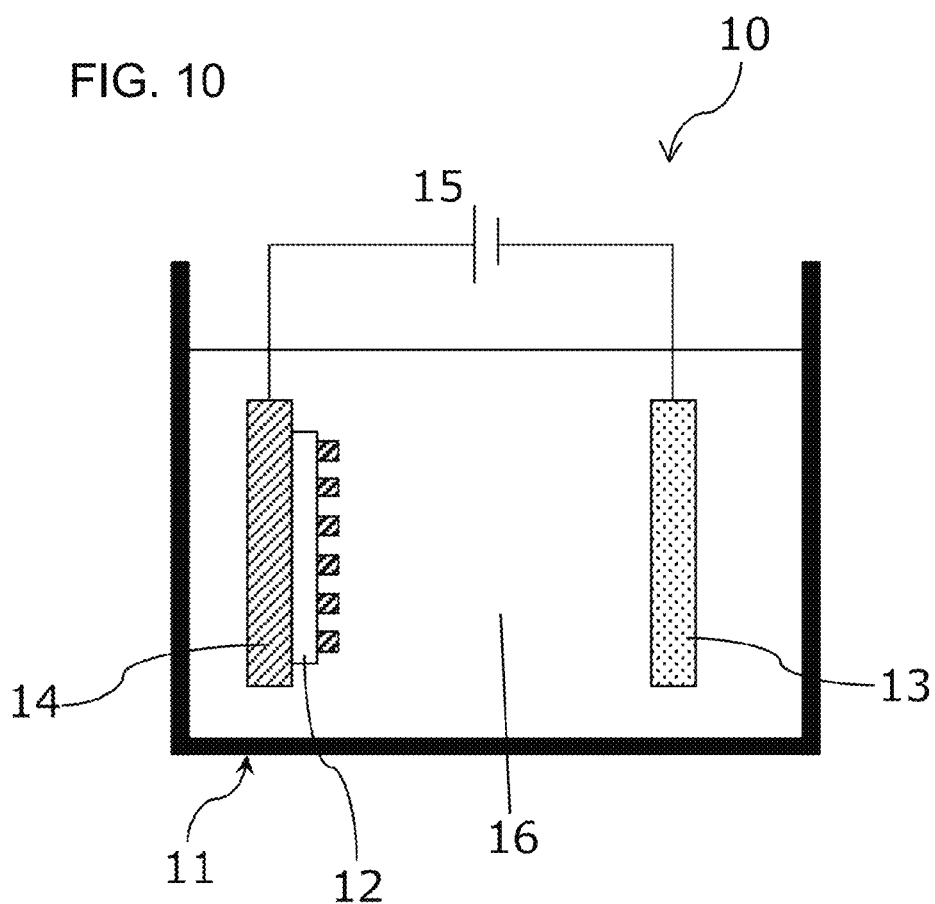
FIG. 10 is a structural schematic view of a plating apparatus.

A method for forming a second electroconductive layer by the electrolytic plating method will be described taking acidic copper plating as an example. FIG. 10 is a conceptual view of a plating apparatus 10 that is used for forming the second electroconductive layer. A substrate 12, which has a first electroconductive layer and an insulating layer formed on a photoelectric conversion section, and is subjected to an annealing treatment, and an anode 13 are immersed in a plating solution 16 in a plating tank 11. The first electroconductive layer 71 on the substrate 12 is connected to a power source 15 through a substrate holder 14. By applying a voltage between the anode 13 and the substrate 12, copper can be selectively deposited at a part on the first electroconductive layer, which is not covered with the insulating layer 9, i.e. an opening section generated in the insulating layer by the annealing treatment, as an origination point.

The plating solution 16 used for acidic copper plating contains copper ions. For example, a solution of known composition, which has copper sulfate, sulfuric acid, and water as main components, can be used, and by causing a current of 0.1 to 10 $A/dm^2$ to pass therethrough, a metal as the second electroconductive layer can be deposited. The suitable plating time is appropriately set according to the area of a collecting electrode, the current density, cathode current efficiency, desired thickness, and so on. When the current density during plating is excessively low, the deposition rate is so low that productivity is deteriorated, and when the current density is excessively high, the resistance of the second electroconductive layer tends to increase. Therefore, the current density during plating is preferably 0.1 to 10 $A/dm^2$ as described above, and more preferably 0.5 to 8 $A/dm^2$, further preferably 1 to 7 $A/dm^2$.

The second electroconductive layer may be composed of a plurality of layers. For example, by forming a first plating layer, made of a material having a high electroconductivity, such as Cu, on the first electroconductive layer with an insulating layer interposed therebetween, and then forming on the surface of the first plating layer a second plating layer excellent in chemical stability, a collecting electrode having low resistance and being excellent in chemical stability can be formed.

It is preferable that after carrying out the plating step, a plating solution removing step be provided to remove a plating solution remaining on the surface of the substrate 12. By providing the plating solution removing step, a metal that can be deposited at a part, other than at the opening section 9h of the insulating layer 9 formed in the annealing treatment, as an origination point can be removed. Examples of the metal deposited at a part other than at the opening section 9h as an origination point include those deposited at a pinhole in the insulating layer 9 as an origination point. As a result of removing such a metal by the plating solution removing step, the shading loss is reduced, so that solar cell characteristics can be further improved.

Removal of the plating solution can be performed by, for example, a method in which plating solution remaining on the surface of the substrate 12 taken out from a plating tank is removed by air blow-type air washing, rinsing is then carried out, and a washing fluid is blown off by air blow. By reducing the amount of plating solution remaining on the surface of the substrate 12 by carrying out air washing before rinsing, the amount of the plating solution brought in at the time of rinsing can be decreased. Therefore, the amount of washing fluid required for rinsing can be decreased, and time and effort for waste liquid treatment associated with rinsing can also be reduced, so that environmental burdens and expenses resulting from washing are reduced, and productivity of the solar cell can be improved.

Here, in general, a transparent electrode layer of ITO or the like and an insulating layer of silicon oxide or the like are hydrophilic. Therefore, the contact angle of the surface of the substrate 12, i.e. the surface of the photoelectric conversion section 50 or the surface of the insulating layer 9, with water is often about 10° or less. In the present invention, the contact angle of the surface of the substrate 12 is preferably 20° or more. It is preferable that the surface of the substrate 12 be subjected to a water-repellent treatment for ensuring that the contact angle falls within the aforementioned range. The water-repellent treatment is, for example, formation of a water-repellent layer on the surface. As a result of the water-repellent treatment, the contact angle to water can be increased by reducing the wettability of the substrate surface to a plating solution. The water-repellent treatment in this specification means a treatment for reducing the wettability of the surface to water (increasing the contact angle). As a result of the water-repellent treatment, removal of the plating solution from the surface of the substrate 12 becomes easy.

In the present invention, an insulating layer removing step may be carried out after forming the collecting electrode (plating step). In particular, when a material having large optical absorption is used as the insulating layer, the insulating layer removing step is preferably carried out for suppressing reduction of solar cell characteristics by the optical absorption of the insulating layer. The method for removing the insulating layer is appropriately selected according to the characteristics of the insulating layer material. For example, the insulating layer can be removed by chemical etching or mechanical polishing. An ashing (incineration) method is also applicable depending on the material. At this time, it is preferable that the insulating layer on the first electroconductive layer-non-formed region is entirely removed, so that an influx of light is further improved. When the water-repellent layer is formed on the insulating layer, the water-repellent layer is preferably removed together with the insulating layer. When a material having small optical absorption is used as the insulating layer, it is not necessary to carry out the insulating layer removing step.

Explanations have been provided principally for the case of providing the collecting electrode 70 on the light incident side of the heterojunction solar cell, but a similar collecting electrode may also be formed on the back side. A solar cell using a crystalline silicon substrate, like the heterojunction solar cell, has a high current value, so that generally the electricity generation loss due to a loss of contact resistance between the transparent electrode layer and the collecting electrode tends to be remarkable. In contrast, in the present invention, the collecting electrode having the first electroconductive layer and the second electroconductive layer has low contact resistance with the transparent electrode layer, thus making it possible to reduce the electricity generation loss resulting from contact resistance.

The present invention is applicable to various kinds of solar cells such as: crystalline silicon solar cells other than the heterojunction solar cell; solar cells using a semiconductor substrate other than silicon, such as GaAs; silicon-based thin-film solar cells having a transparent electrode layer on a pin junction or a pn junction of an amorphous silicon-based thin-film or a crystalline silicon-based thin-film; compound semiconductor solar cells such as CIS and GIGS; and organic thin-film solar cells, such as dye-sensitized solar cells and organic thin-film (electroconductive polymer).

The crystalline silicon solar cell includes a configuration in which a diffusion layer of an opposite conductivity type (e.g. n-type) is provided on one main surface of a crystalline silicon substrate of a first conductivity type (e.g. p-type), and the collecting electrode is provided on the diffusion layer. This crystalline silicon solar cell generally includes a conductive layer such as a $p^+$ layer on a side opposite to the layer of the first conductivity type. Thus, when the photoelectric conversion section does not include an amorphous silicon layer or a transparent electrode layer, the thermal-fluidization onset temperature $T_1$ of the low-melting-point material and the annealing temperature Ta may be higher than 250° C.

Examples of the silicon-based thin-film solar cell include an amorphous silicon-based thin-film solar cell having an amorphous intrinsic (i-type) silicon thin-film between a p-type thin-film and an n-type thin-film, and a crystalline silicon-based semiconductor solar cell having a crystalline intrinsic silicon thin-film between a p-type thin-film and an n-type thin-film. A tandem-type thin-film solar cell, in which a plurality of pin junctions is stacked, is also suitable. In this silicon-based thin-film solar cell, the thermal-fluidization onset temperature $T_1$ of the low-melting-point material and the annealing temperature Ta are preferably 250° C. or lower, more preferably 200° C. or lower, further preferably 180° C. or lower, in consideration of the heat resistance of the transparent electrode layer and the amorphous silicon-based thin-film.

Figure 7:
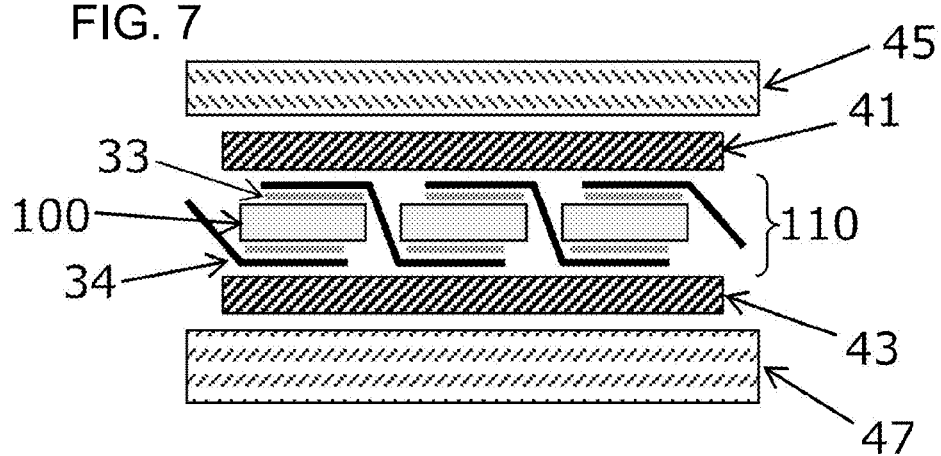
FIG. 7 is a schematic sectional view showing a solar cell module according to one embodiment of the present invention.

The solar cell of the present invention is preferably modularized and put into practical use, for example, as shown in FIG. 7. Modularization of the solar cell is performed by an appropriate method. For example, by connecting a wiring member to a collecting electrode, a plurality of solar cells are connected in series or in parallel, and sealed by a sealing material and a glass plate to thereby perform modularization.

The solar cell module includes a wiring member 34 for electrically connecting solar cells, or electrically connecting a solar cell and an external circuit. Preferably, the solar cell 100 and the wiring member 34 are bonded to each other by a resin adhesive 33 containing electroconductive fine particles.

Figure 8:
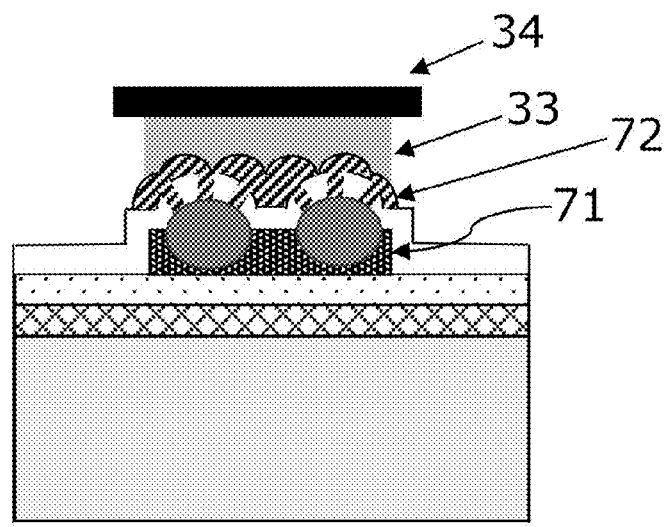
FIG. 8 is a schematic sectional view showing a connection between a collecting electrode and a wiring member according to one embodiment of the present invention.
Figure 9:
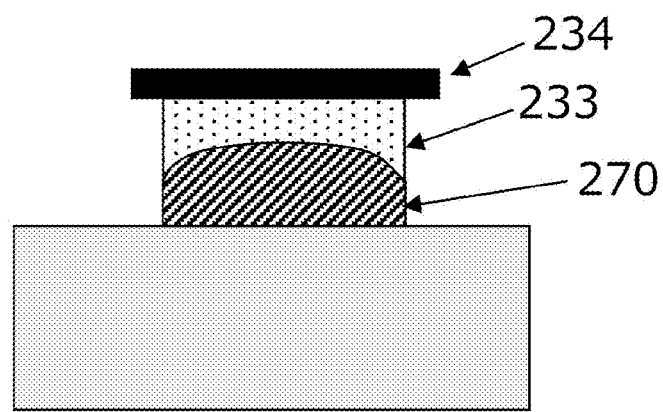
FIG. 9 is a schematic sectional view showing a connection between a collecting electrode and a wiring member in the conventional art.

As shown in FIG. 8, the resin adhesive 33 is formed on the second electroconductive layer 72 of the collecting electrode. As shown in FIG. 9, a resin adhesive 233 containing electroconductive fine particles has been conventionally used for connecting a collecting electrode 270 of the solar cell and a wiring member 234, but there is the problem that reliability is deteriorated due to peeling between the resin adhesive and the collecting electrode. In the present invention, adhesion between the collecting electrode and the resin adhesive is enhanced because the surface roughness Ra2 of the second electroconductive layer on the surface of the collecting electrode is in a specific range.

As the resin adhesive, for example, one obtained by adding electroconductive particles to a resin paste can be used. As the resin paste, for example, an epoxy resin, an imide resin, a phenol resin or the like is used. As the electroconductive particles, for example, a metallic powder of Ni, Cu, Zn, In, or the like is used. Besides the metallic powder, an electroconductive powder such as a carbon powder, or a powder in which the surfaces of insulating particles composed of an epoxy resin, an acryl resin, a polyimide resin, a phenol resin, or the like are coated with an electroconductive material such as metal can be used as the electroconductive particles.

In preparation of the solar cell module, a solar cell string 110 is first prepared in which a plurality of solar cells 100 are mutually connected via the wiring member 34. The solar cell 100 and the wiring member 34 are bonded to each other via the resin adhesive 33. The solar cell string is held between protective materials 45 and 47 with sealing members 41 and 43 interposed therebetween, and the solar cell is formed. For the sealing member and the protective member, it is preferred that the sealing member 41, the solar cell string 110, the sealing material 43 and the protective material 47 on the back surface side are sequentially stacked on the protective material 45 on the light reception surface side to form a laminate, and the laminate is then heated under specific conditions to cure the sealing materials 41 and 43. Then, a solar cell module can be prepared by mounting an Al frame (not illustrated) or the like.

Preferably, the protective material 45 on the light reception surface side is disposed on the light reception surface side (light incident surface side) of the solar cell string 110 to protect the surface of the solar cell module. As the protective material on the light reception surface side, a glass having translucency and water impermeability, a translucent plastic or the like can be used. Preferably, the protective material 47 on the back surface side is disposed on the back surface side of the solar cell string 110 to protect the back surface of the solar cell module. As the protective material on the back surface side, a resin film such as that of PET (polyethylene terephthalate), a laminated film having a structure with an Al foil sandwiched by resin films, or the like can be used.

The sealing materials 41 and 43 seal the solar cell string 110 between the protective material 45 on the light reception surface side and the protective material 47 on the back surface side. As the sealing material, a translucent resin such as that of EVA, EEA, PVB, silicon, urethane, acryl, or epoxy can be used.

The solar cell module can be prepared in the manner described above, but the solar cell module of the present invention is not limited to that described above.

EXAMPLES

The present invention will be more specifically described below by showing examples relating to the heterojunction solar cell shown in FIG. 2, but the present invention is not limited to the Examples below.

(Measurement of Surface Roughness)

The surface roughness Ra of the surface of each of the first electroconductive layer and the second electroconductive layer was measured according to JIS B 0601:2001 (corresponding to ISO 4287:1997) using Laser Microscope VK-8510 manufactured by KEYENCE CORPORATION.

(Measurement of Viscosity)

The viscosity of the printing paste was measured at a solution temperature of 25° C. and a rotation speed of 10 rpm using a rotational viscometer manufactured by Brookfield Ltd.

Example 1

A heterojunction solar cell of Example 1 was manufactured in the following manner.

An n-type single-crystal silicon wafer having a light incident surface direction identical to the (100) surface and having a thickness of 200 μm was provided as a single-crystal silicon substrate of a first conductivity type. The silicon wafer was immersed in a 2 wt % aqueous HF solution for 3 minutes to remove silicon oxide covering on the surface, and thereafter rinsed twice with ultrapure water. The silicon substrate was immersed in a 5/15 wt % aqueous KOH/isopropyl alcohol solution held at 70° C. for 15 minutes, and the surface of the wafer was etched to form a textured surface. Thereafter, the wafer was rinsed twice with ultrapure water. The surface of the wafer was observed using an atomic force microscope (AFM manufactured by Pacific Nanotechnology, Inc.), and it was confirmed that the surface of the wafer was etched, and a pyramidal texture surface exposed at the (111) plane was formed.

The wafer after etching was introduced into a CVD apparatus, and at the light incident side thereof, i-type amorphous silicon was formed with a thickness of 5 nm as an intrinsic silicon-based thin-film 2a. Conditions for forming i-type amorphous silicon included a substrate temperature of 170° C., a pressure of 100 Pa, a $SiH_4/H_2$ flow ratio of 3/10 and a power density supply of 0.011 W/cm$^2$. The thickness of the thin-film in this example is a value calculated from a formation rate determined by measuring the thickness of a thin-film formed on a glass substrate under the same conditions using a spectroscopic ellipsometry (trade name: M2000, manufactured by J.A. Woollam Co. Inc.).

On the i-type amorphous silicon layer 2a, p-type amorphous silicon was formed with a thickness of 7 nm as a silicon-based thin-film 3a of an opposite conductivity type. Conditions for forming the p-type amorphous silicon layer 3a included a substrate temperature of 170° C., a pressure of 60 Pa, a $SiH_4/B_2H_6$ flow ratio of 1/3 and a power density supply of 0.01 W/cm$^2$. The $B_2H_6$ gas flow rate mentioned above is a flow rate of a diluting gas wherein $B_2H_6$ concentration was diluted to 5000 ppm using $H_2$ gas.

Thereafter, on the back side of the wafer, an i-type amorphous silicon layer was formed with a thickness of 6 nm as an intrinsic silicon-based thin-film 2b. Conditions for forming the i-type amorphous silicon layer 2b were the same as those for the aforementioned i-type amorphous silicon layer 2a. On the i-type amorphous silicon layer 2b, an n-type amorphous silicon layer was formed with a thickness of 4 nm as a silicon-based thin-film 3b of the first conductivity type. Conditions for forming the n-type amorphous silicon layer 3b included a substrate temperature of 170° C., a pressure of 60 Pa, a $SiH_4/PH_3$ flow ratio of 1/2 and a power density supply of 0.01 W/cm$^2$. The $PH_3$ gas flow rate mentioned above is a flow rate of a diluting gas wherein $PH_3$ concentration was diluted to 5000 ppm using $H_2$ gas.

Indium tin oxide (ITO, refractive index: 1.9) was formed thereon with a thickness of 100 nm as transparent electrode layers 6a and 6b, respectively. The transparent electrode layer was formed by applying a power density of 0.5 W/cm$^2$ in an argon atmosphere at a substrate temperature of room temperature and a pressure of 0.2 Pa using indium oxide as a target. On the back side transparent electrode layer 6b, silver was formed with a thickness of 500 nm as a back side metal electrode 8 by a sputtering method. A collecting electrode 70 having a first electroconductive layer 71 and a second electroconductive layer 72 was formed on the light incident side transparent electrode layer 6a in the following manner.

For formation of the first electroconductive layer 71, a printing paste (viscosity=80 Pa·s) containing SnBi metal powder (particle size $D_L$=25 μm; melting point $T_1$=141° C.) as a low-melting-point material and a silver powder (particle size $D_H$=2 to 3 μm; melting point $T_2$=971° C.) as a high melting-point material at a weight ratio of 20:80, and further containing an epoxy-based resin as a binder resin was used. The printing paste was screen-printed using a screen plate of #230 mesh (opening width: l=85 μm) having an opening width (L=80 μm) matching a collecting electrode pattern, and dried at 90° C.

The wafer with the first electroconductive layer 71 formed thereon was introduced into a CVD apparatus, and a silicon oxide layer (refractive index: 1.5) was formed on the light incident surface side with a thickness of 100 nm as an insulating layer 9 by a plasma-enhanced CVD method.

Figure 11:
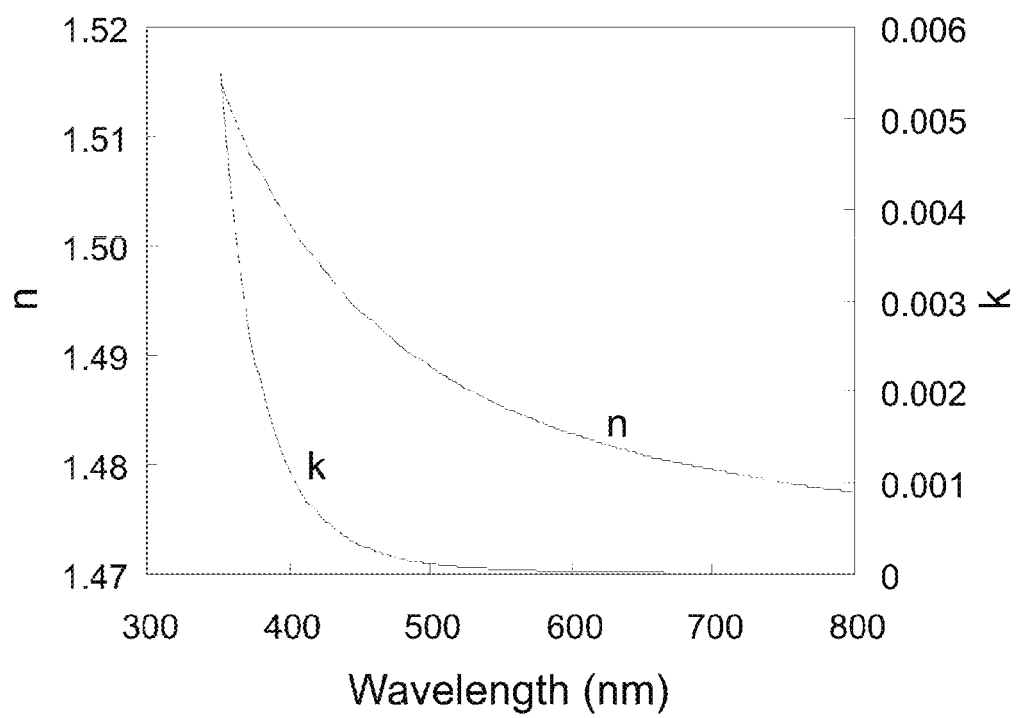
FIG. 11 is a view showing optical characteristics of an insulating layer in Examples.

Conditions for forming the insulating layer 9 included a substrate temperature of 135° C., a pressure of 133 Pa, a $SiH_4/CO_2$ flow ratio of 1/20, and a power density supply of 0.05 W/cm$^2$ (frequency 13.56 MHz). The refractive index (n) and extinction coefficient (k) of the insulating layer formed on the light incident side under the conditions were as shown FIG. 11. Thereafter, the wafer after formation of the insulating layer was introduced into a circulating hot air oven, and subjected to an annealing treatment at 180° C. for 20 minutes in an air atmosphere.

The substrate 12 subjected to steps up to and including the annealing step as described above was introduced into a plating tank 11 as shown in FIG. 10. For a plating solution 16, one obtained by adding additives (product numbers: ESY-2B, ESY-H and ESY-1A, manufactured by Uyemura & CO., LTD.) to a solution prepared so that the concentrations of copper sulfate pentahydrate, sulfuric acid, and sodium chloride were 120 g/l, 130 g/l, and 70 mg/l, respectively, was used. Using the plating solution, plating was carried out under conditions including a temperature of 40° C. and a current of 4 A/dm$^2$, so that on the insulating layer on the first electroconductive layer 71, copper was uniformly deposited at a thickness of about 10 μm as a second electroconductive layer 72. Little copper was deposited onto a region where no first electroconductive layer was formed.

Thereafter, the silicon wafer on the cell outer periphery was removed in a width of 0.5 mm by a laser processing apparatus to prepare the heterojunction solar cell of the present invention.

Next, as the resin adhesive 33, an electroconductive resin adhesive formed by mixing spherical Ni particles of about 10 μm (in diameter) in an epoxy resin was applied onto the second electroconductive layer, a wiring member was disposed thereon, and a pressure of 2 MPa was then applied. Thereafter, a heat treatment was performed at 190° C. for 1 hour to cure the epoxy resin.

A solar cell with the wiring member 34 attached thereto was provided in the manner described above, and glass, EVA (sealing material), the solar cell, EVA, and a back surface protective sheet were laminated in this order. Thereafter, the laminate was heated and compressed at atmospheric pressure for 5 minutes to seal the solar cell with the EVA resin. Subsequently, the laminate was held at 150° C. for 50 minutes to crosslink the EVA resin, thereby preparing a solar cell module.

Examples 2 and 3 and Reference Example 2

A heterojunction solar cell was prepared and modularized in the same manner as in Example 1 except that the viscosity of the printing paste for formation of the first electroconductive layer 71 and the particle size of the low-melting-point material were changed as shown in Table 1.

Example 4 and Reference Example 1

A printing paste which contained silver fine particles having a particle size of $D_L$=0.3 to 0.7 μm as a low-melting-point material and did not contain a high-melting-point material was used as a printing paste for formation of the first electroconductive layer 71. The viscosity of the printing paste was as shown in Table 1. A heterojunction solar cell was prepared and modularized in the same manner as in Example 1 except that the aforementioned printing paste was used.

Comparative Example 1

Steps up to and including formation of the first electroconductive layer (silver electrode) 71 were performed in the same manner as in Example 1 except that a silver paste containing no low-melting-point material (i.e., the ratio of a metallic material powder to a silver powder was 0:100) was used as a printing paste for formation of a first electroconductive layer, and screen printing was performed in a shape corresponding to a collecting electrode pattern, followed by drying at 180° C. Thereafter, a heterojunction solar cell having the silver electrode as a collecting electrode was prepared and modularized without performing any of an insulating layer forming step, an annealing treatment, and a second electroconductive layer forming step.

Comparative Examples 2 and 3

A heterojunction solar cell was prepared in the same manner as in Example 1 except that the type and particle size of the low-melting-point material in the printing paste for formation of the first electroconductive layer 71 were changed as shown in Table 1. Thereafter, a second electroconductive layer was formed by a plating method without performing an insulating layer forming step and an annealing treatment. In Comparative Examples 2 and 3, the second electroconductive layer could be formed, but such a problem arose that a transparent electrode layer was fully etched during a plating treatment, and an article functioning as a solar cell was not obtained.

Comparative Examples 4 to 6

In Comparative Examples 4, 5, and 6, a first electroconductive layer was formed using a printing paste for formation of the first electroconductive layer 71, which was similar to that in each of Reference Example 1, Example 1, and Reference Example 2, respectively, and an insulating layer was formed. Thereafter, an attempt was made to form a second electroconductive layer by a plating method without performing an annealing treatment, but copper was not deposited, and the second electroconductive layer was not formed.

Comparative Example 7

In Comparative Example 7, a first electroconductive layer was formed using a silver paste similar to that in Comparative Example 1, followed by forming an insulating layer. Thereafter, an annealing treatment was performed in the same manner as in Example 1 and an attempt was made to form a second electroconductive layer by a plating method, but copper was not deposited, and the second electroconductive layer was not formed.

[Evaluation]

(Measurement of Solar Cell Power)

Solar cell characteristics of the heterojunction solar cell of each of Examples, Reference Examples, and Comparative Examples were measured.

(Peel Strength Test)

A relationship between the surface roughness of the surface of the electroconductive layer before and after plating and the peel strength of a member attached to a plated film using a resin adhesive was examined. Specifically, a transparent electrode layer composed of ITO and having a thickness of 100 nm was formed on a glass plate, and a collecting electrode was formed thereon in the same manner as in Examples 1 to 3, Reference Examples 1 and 2, and Comparative Examples 1 to 3. A copper foil having a width of 1 mm, a length of 100 mm, and a thickness of 100 μm was bonded onto the collecting electrode using an electroconductive resin adhesive. Specifically, as the electroconductive resin adhesive, a film-shaped electroconductive resin adhesive, which was composed of an epoxy-based resin containing about 8% by mass of a Ni filler having an average particle size of 2 μm to 5 μm and had a width of 1 mm, a length of 50 mm, and a thickness of 25 μm, was disposed on the collecting electrode, and the copper foil was disposed thereon, and pressed at 200° C. and 0.25 MPa for 30 minutes to bond the copper foil onto the collecting electrode. Thereafter, using a peel strength tester (MX-2000N manufactured by IMADA CO., LTD.), the copper foil was stretched at a speed of 40 mm/minute along the normal direction of the glass plate, and the maximum load when the copper foil was peeled was defined as a peel strength.

(Temperature Cycle Test)

The temperature cycle test for the solar cell module of each of Examples, Reference Examples, and Comparative Examples was conducted according to JIS C 8917. The power of the solar cell module of each of Examples, Reference Examples, and Comparative Examples before the temperature cycle test was set to 1, and a ratio of the power before the temperature cycle test to the power after the temperature cycle test, i.e., a retention rate before and after the cycle test, was calculated.

The results of the measurements described above are collectively shown in Table 1. In Table 1, the cell characteristic (power) and the peel strength are shown as a relative value with the value in Comparative Example 1 as a reference value (=1).

the present invention has an improved power as compared to a conventional solar cell having a collecting electrode composed of a silver paste electrode. This may be because in the solar cells of the Examples, the resistance of the collecting electrode decreased, so that the fill factor was improved.

Comparison of Examples 1 to 4 and Reference Example 1 with Reference Example 2 shows that the cell characteristic is improved when Ra1 is 1.0 μm or more. This may be

TABLE 1

| | Low-melting-point material | Thermal-fluidization onset temperature T1 | Low-melting-point material size μm | Viscosity of printing paste Pa · sec at 25° C. | Ra1 μm | Ra2 μm | Insulating layer | Annealing temperature (Ta) | Cell characteristic | Peeling strength | Retention rate |
|---|---|---|---|---|---|---|---|---|---|---|---|
| Reference Example 1 | Ag fine particles | 150 | 0.5 | 80 | 0.8 | 0.9 | Present | 180° C. | 1.01 | 1.03 | 0.95 |
| Example 4 | | | 0.5 | 300 | 1.5 | 1.8 | | | 1.03 | 1.18 | 0.98 |
| Example 1 | SnBi | 141 | 25 | 80 | 3.1 | 3.4 | | | 1.03 | 1.18 | 0.98 |
| Example 2 | | | 25 | 300 | 4.2 | 4.3 | | | 1.03 | 1.24 | 0.99 |
| Example 3 | | | 50 | 80 | 8.5 | 8.8 | | | 1.03 | 1.21 | 0.98 |
| Reference Example 2 | | | 50 | 300 | 11 | 11.3 | | | 1.03 | 1.16 | 0.93 |
| Comparative Example 1 | Absent | Absent | Absent | 80 | 0.7 | 0.7 | Absent | — | 1 | 1 | 0.92 |
| Comparative Example 2 | Ag fine particles | 150 | 0.5 | 80 | 0.8 | 0.8 | | | Not evaluated | 0.92 | Not evaluated |
| Comparative Example 3 | SnBi | 141 | 50 | 80 | 8.1 | 8.2 | | | Not evaluated | 0.98 | Not evaluated |
| Comparative Example 4 | Ag fine particles | 150 | 0.5 | 300 | 1.5 | — | Present | — | | — | |
| Comparative Example 5 | SnBi | 141 | 25 | 300 | 4.2 | — | | | | — | |
| Comparative Example 6 | SnBi | 141 | 50 | 300 | 11 | — | | | | — | |
| Comparative Example 7 | Absent | Absent | Absent | 80 | 0.7 | — | | 180° C. | | — | |

The reason why copper was deposited as the second electroconductive layer by the plating step in the Examples is because an opening section was formed in the insulating layer on the first electroconductive layer-formed region by the annealing treatment, the first electroconductive layer contacted (was conductively connected with) the plating solution, and plating was performed with the opening section as an origination point for deposition. On the other hand, in Comparative Example 7, copper was not deposited although an annealing treatment was performed. This may be because the first electroconductive layer did not contain a low-melting-point material, and therefore an opening was not formed in the insulating layer thereon even if a heating treatment was performed.

In Comparative Examples 4 to 6, the first electroconductive layer contained a low-melting-point material, but copper was not deposited. This may be because an annealing treatment was not performed, and therefore an opening was not formed in the insulating layer. From the results, it is apparent that for forming an opening in the insulating layer without performing an annealing treatment, it is necessary to form a first electroconductive layer having a rough shape such that the surface roughness Ra1 is several tens of micrometers or more.

From Table 1, it is apparent that by changing the viscosity of the printing paste for formation of the first electroconductive layer 71 or the particle size of the low-melting-point material, the surface roughness Ra1 of the surface of the first electroconductive layer and the surface roughness Ra2 of the second electroconductive layer can be changed.

Comparison of the power of each of the Examples with that of Comparative Example 1 shows that the solar cell of because when Ra1 is 1.0 μm or more, adhesion between the first electroconductive layer and the second electroconductive layer is improved.

In Examples 1 to 3 and Reference Examples 1 and 2, the peel strength was improved as compared to Comparative Example 1. In Examples 1 to 4 and Reference Example 2 where Ra2 was 1.0 μm or more, the peel strength was improved as compared to Reference Example 1 where Ra2 was less than 1.0 μm. In Examples 4, 1, and 2, the peel strength tended to be improved as Ra2 increased further from 1.0 μm, and in Examples 2 and 3 and Reference Example 2, the peel strength tended to be decreased as Ra2 further increased. From the results, it is considered that when Ra2 is about 3.0 to 6.0 μm, the peel strength is particularly improved, so that a high anchor effect was obtained. The reason why the peel strength was decreased as Ra2 increased in comparison of Examples 2 and 3 with Reference Example 2 may be because the number of irregularities per unit area decreased, leading to a reduction in surface area.

There is almost no difference in Ra2 between Comparative Example 2 and Reference Example 1, but it is apparent that the peeling strength in Reference Example 1 is greater than that in Comparative Example 2. There is almost no difference in Ra2 between Comparative Example 3 and Example 3, but it is apparent that the peeling strength in Example 3 is greater than that in Comparative Example 3. This may be because in Reference Example 1 and Example 3, an insulating layer is provided between the first electroconductive layer and the second electroconductive layer, and therefore adhesion between the second electroconductive layer and the undercoat of the second electroconductive layer is improved, so that interlayer peeling is suppressed to contribute to the peeling strength of the collecting electrode.

It is apparent that the solar cell modules of Examples 1 to 3 have a high retention rate after the temperature cycle test as compared to the solar cell module of Comparative Example 1 which has a collecting electrode composed of a silver paste electrode. This may be because in the solar cell modules of Examples, both Ra1 and Ra2 were in a range of 1 to 10 μm, so that not only adhesion strength between the first electroconductive layer and the second electroconductive layer but also adhesion strength between the second electroconductive layer and the resin adhesive was high, leading to suppression of defects such as film peeling in the temperature cycle test.

As described above using the Examples, according to the present invention, a solar cell having a high power and being excellent in durability after modularization can be provided at low costs.

DESCRIPTION OF REFERENCE CHARACTERS 1 single-crystal silicon substrate of a first conductivity type
2 intrinsic silicon-based thin-film
3 conductive silicon-based thin-film
6 transparent electrode layer
70 collecting electrode
71 first electroconductive layer
711 low-melting-point material
72 second electroconductive layer
8 back side metal electrode
9 insulating layer
9h opening section
50 photoelectric conversion section
100 solar cell
101 heterojunction solar cell
10 plating apparatus
11 plating tank
12 substrate
13 anode
14 substrate holder
15 power source
16 plating solution
33 resin adhesive
34 wiring member

The invention claimed is:

1. A solar cell comprising:
a photoelectric conversion section having a first main surface and a second main surface;
a first electrode provided on the first main surface; and a second electrode provided on the second main surface, wherein
the first electrode is a collecting electrode,
the collecting electrode includes a continuous first electroconductive layer and a continuous second electroconductive layer in this order away from the photoelectric conversion section,
and further includes an insulating layer covering the first electroconductive layer and sandwiched between the first electroconductive layer and the second electroconductive layer, the insulating layer having a plurality of opening sections formed between the first electroconductive layer and second electroconductive layer;
the first electroconductive layer contains a low-melting-point material, and a thermal-fluidization onset temperature ($T_1$) of the low-melting-point material is 250° C. or lower;
a plurality of portions of the second electroconductive layer extend through the plurality of opening sections of the insulating layer to make direct contact with the first electroconductive layer, wherein segments of the insulating layer are disposed between adjacent portions among the plurality of portions of the second electroconductive layer; and
a surface roughness (Ra2) of the second electroconductive layer is 1.0 μm or more and 10.0 μm or less.

2. The solar cell according to claim 1, wherein a surface roughness (Ra1) of the first electroconductive layer is 1.0 μm or more and 10.0 μm or less.

3. The solar cell according to claim 1, wherein
the photoelectric conversion section comprises: a silicon-based thin film and a transparent electrode layer disposed on a first surface of a crystalline silicon substrate of a first conductivity type;
wherein the transparent electrode layer is disposed between the collecting electrode and the silicon-based thin film.

4. The solar cell of claim 1, wherein the insulating layer is also formed on a portion of the photoelectric conversion layer not covered by the first electroconductive layer and the second electroconductive layer.

5. A solar cell module comprising the solar cell according to claim 1.

6. A solar cell module comprising:
the solar cell according to claim 1; and
a wiring member, wherein
the solar cell is connected to another solar cell or an external circuit via the wiring member; and
the collecting electrode of the solar cell and the wiring member are bonded to each other by a resin adhesive containing electroconductive fine particles.

7. The solar cell according to claim 1, wherein the first main surface of the photoelectric conversion section is on a light incident side of the solar cell.

* * * * *